United States Patent
Ro et al.

(10) Patent No.: US 9,459,478 B2
(45) Date of Patent: Oct. 4, 2016

(54) DISPLAY APPARATUS AND METHOD OF MANUFACTURING THE SAME

(71) Applicant: Samsung Display Co., Ltd., Yongin, Gyeonggi-Do (KR)

(72) Inventors: Sungin Ro, Hwaseong-si (KR); HyunWuk Kim, Yongin-si (KR); Ock Soo Son, Seoul (KR); Jeanho Song, Yongin-si (KR); Eunje Jang, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 74 days.

(21) Appl. No.: 14/268,400

(22) Filed: May 2, 2014

(65) Prior Publication Data

US 2015/0131017 A1    May 14, 2015

(30) Foreign Application Priority Data

Nov. 13, 2013   (KR) .................... 10-2013-0137806

(51) Int. Cl.

| G02F 1/1333 | (2006.01) |
|---|---|
| H01L 27/12 | (2006.01) |
| G02F 1/1368 | (2006.01) |
| G02F 1/1339 | (2006.01) |
| G02F 1/1335 | (2006.01) |
| G02F 1/1362 | (2006.01) |

(52) U.S. Cl.
CPC ....... *G02F 1/133345* (2013.01); *G02F 1/1339* (2013.01); *G02F 1/1368* (2013.01); *G02F 1/133305* (2013.01); *G02F 1/133512* (2013.01); *G02F 1/136227* (2013.01); *G02F 1/136286* (2013.01); *H01L 27/127* (2013.01); *H01L 27/1262* (2013.01); *G02F 2001/133388* (2013.01); *G02F 2001/136222* (2013.01); *G02F 2202/02* (2013.01)

(58) Field of Classification Search
CPC .......... G02F 1/133345; G02F 1/1368; G02F 1/133305; G02F 1/1339; G02F 1/133512; G02F 1/136227; G02F 1/136286; G02F 2001/136222; G02F 2001/133388; G02F 2202/02; H01L 27/127; H01L 27/1262
USPC ....................................................... 349/141
See application file for complete search history.

(56) References Cited

U.S. PATENT DOCUMENTS

| 6,720,944 B1* | 4/2004 | Ishii ..................... G02F 1/1339 345/87 |
|---|---|---|
| 7,045,944 B2 | 5/2006 | Ushifusa et al. |
| 7,643,109 B2 | 1/2010 | Kawashima et al. |
| 7,652,732 B2 | 1/2010 | Kawashima et al. |

(Continued)

FOREIGN PATENT DOCUMENTS

| JP | 2001-147439 | 5/2001 |
|---|---|---|
| JP | 2008-249988 A | 10/2008 |

(Continued)

*Primary Examiner* — Charles Chang
(74) *Attorney, Agent, or Firm* — Innovation Counsel LLP

(57) ABSTRACT

A display apparatus includes a first substrate that includes a display area in which pixels are arranged and a non-display area surrounding the display area, a second substrate disposed to face the first substrate, and a sealing member disposed in the non-display area to attach the second substrate to the first substrate. The first substrate includes a base substrate, a plurality of inorganic insulating layers disposed on the base substrate in the non-display area, and an organic layer disposed on the inorganic insulating layer.

9 Claims, 25 Drawing Sheets

(56) References Cited

U.S. PATENT DOCUMENTS

| | | |
|---|---|---|
| 7,952,679 B2 | 5/2011 | Kim et al. |
| 8,421,983 B2 | 4/2013 | Jung et al. |
| 8,927,993 B2* | 1/2015 | Jung ............ H01L 27/088 257/258 |
| 2003/0001999 A1 | 1/2003 | Kim et al. |
| 2010/0014043 A1 | 1/2010 | Ootaguro et al. |
| 2011/0122357 A1* | 5/2011 | Chang ............ G02F 1/133512 349/155 |
| 2011/0216275 A1* | 9/2011 | Lee ............ G02F 1/1335 349/106 |
| 2013/0099262 A1 | 4/2013 | Yang et al. |
| 2014/0176886 A1* | 6/2014 | Yoshida ............ G02F 1/1339 349/110 |

FOREIGN PATENT DOCUMENTS

| | | |
|---|---|---|
| KR | 1020020045256 A | 12/2000 |
| KR | 1020020047602 A | 12/2000 |
| KR | 1020020094785 A | 6/2001 |

* cited by examiner

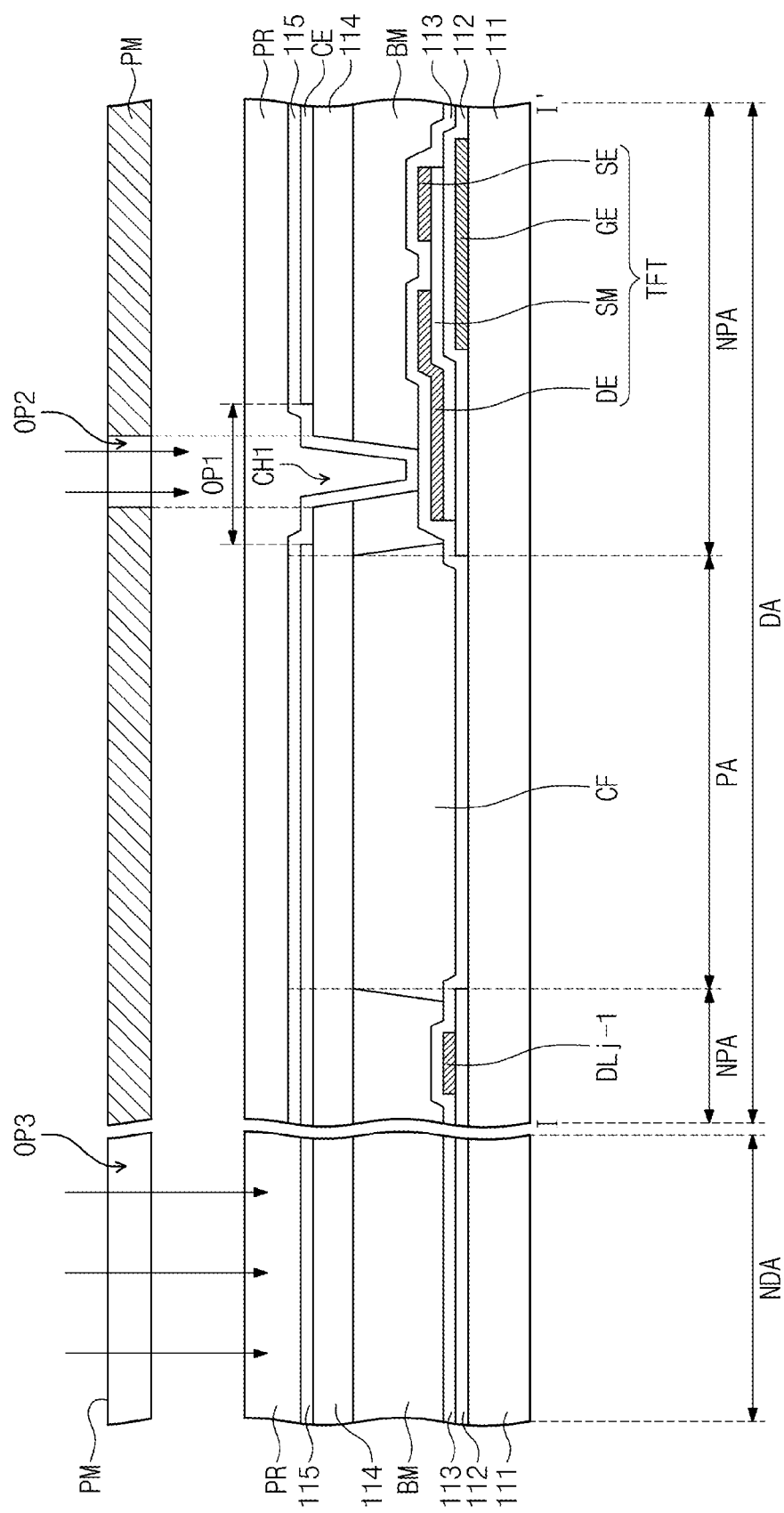

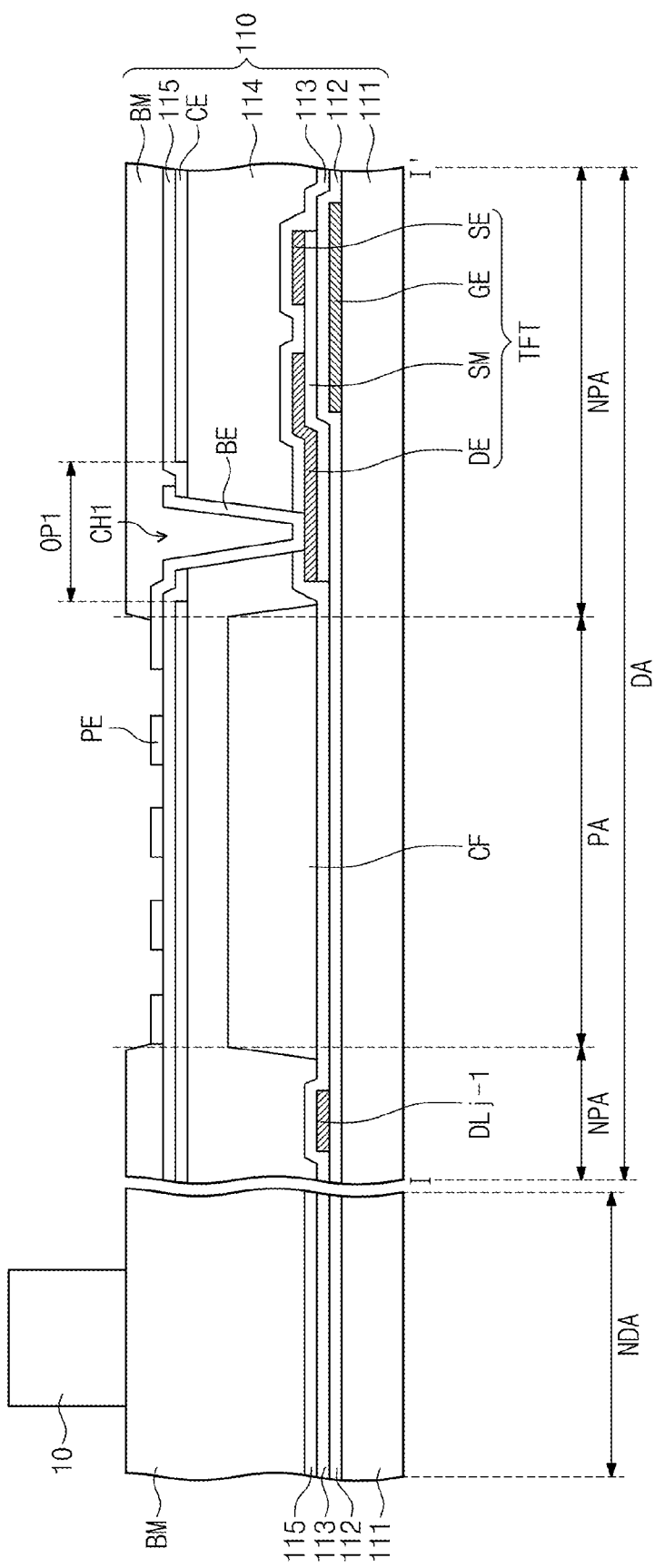

DISPLAY APPARATUS AND METHOD OF MANUFACTURING THE SAME

CROSS-REFERENCE TO RELATED APPLICATION

This U.S. non-provisional patent application claims priority under 35 U.S.C. §119 of Korean Patent Application No. 10-2013-0137806, filed on Nov. 13, 2013, the contents of which are hereby incorporated by reference in its entirety.

BACKGROUND

1. Field of Disclosure

The present disclosure relates to a display apparatus and a method of manufacturing the same. More particularly, the present disclosure relates to a display apparatus having improved reliability and a method of manufacturing the display apparatus.

2. Description of the Related Art

In recent years, various display devices, such as a liquid crystal display device, an organic light emitting display device, an electrowetting display device, a plasma display panel device, an electrophoretic display device, etc., have been developed.

In general, the display device includes two substrates facing each other and an image display part interposed between the two substrates. The two substrates include a display area and a non-display area when viewed in a plan view. The image display part that displays an image is disposed in the display area and a sealing member is disposed in the non-display area. The two substrates disposed to face each other are adhered to each other by the sealing member.

SUMMARY

The present disclosure provides a display apparatus having improved reliability.

The present disclosure provides a method of manufacturing the display apparatus.

Embodiments provide a display apparatus including a first substrate that includes a display area in which pixels are arranged and a non-display area surrounding the display area. A second substrate is disposed to face the first substrate. A sealing member is disposed in the non-display area to attach the second substrate to the first substrate. The first substrate includes a base substrate, a plurality of inorganic insulating layers disposed on the base substrate in the non-display area, and an organic layer disposed on the inorganic insulating layers.

The inorganic insulating layers include a first inorganic insulating layer disposed on the base substrate and a second inorganic insulating layer disposed on the first inorganic insulating layer.

The organic layer includes an organic insulating layer disposed on the second inorganic insulating layer and a black matrix disposed on the organic insulating layer, and the sealing member is disposed on the black matrix.

The first and second inorganic insulating layers include an inorganic material and the organic insulating layer, the black matrix, and the sealing member include an organic material.

Each of the pixels includes a thin film transistor disposed on the base substrate, the second inorganic insulating layer disposed on the base substrate to cover the thin film transistor, the organic insulating layer disposed on the second inorganic insulating layer, a common electrode disposed on the organic insulating layer and including a first opening, a third inorganic insulating layer disposed on the organic insulating layer to cover the common electrode, and a pixel electrode disposed on the third inorganic insulating layer in a pixel area corresponding to the pixel. The pixel electrode is connected to the thin film transistor through a first contact hole formed through the second inorganic insulating layer, the organic insulating layer, and the third inorganic insulating layer, the first opening is overlapped with the first contact hole and has a size greater than a size of the first contact hole, and the first inorganic insulating layer is disposed on the base substrate to cover a gate electrode of the thin film transistor.

The pixel further includes a color filter disposed between the second inorganic insulating layer and the organic insulating layer in the pixel area, and the black matrix is disposed on the third inorganic insulating layer in the non-display area disposed adjacent to the pixel area.

The pixel electrode includes a plurality of branch portions disposed to be spaced apart from each other at regular intervals, a first connection portion that connects one ends of the branch portions in a direction in which the branch portions extend, and a second connection portion that connects the other ends of the branch portions.

Embodiments provide a method of manufacturing a display apparatus as follows. A base substrate is prepared that includes a display area in which pixels are disposed and a non-display area disposed adjacent to the display area. A plurality of inorganic insulating layers are formed on the base substrate in the non-display area. An organic layer is formed on the inorganic insulating layers. A sealing member is formed on the organic layer. A second substrate is disposed to face the base substrate, and the second substrate is attached to the sealing member.

According to the above, the display apparatus may have the improved reliability.

BRIEF DESCRIPTION OF THE DRAWINGS

The above and other advantages of the present disclosure will become readily apparent by reference to the following detailed description when considered in conjunction with the accompanying drawings wherein:

FIGS. 9A, 9B, 9C, 9D, 9E are cross-sectional views showing a manufacturing method of the display apparatus according to the second exemplary embodiment;

FIGS. 11A, 11B, 11C, 11D, 11E, 11F are cross-sectional views showing a manufacturing method of the display apparatus according to the third exemplary embodiment.

DETAILED DESCRIPTION

Figure 1:
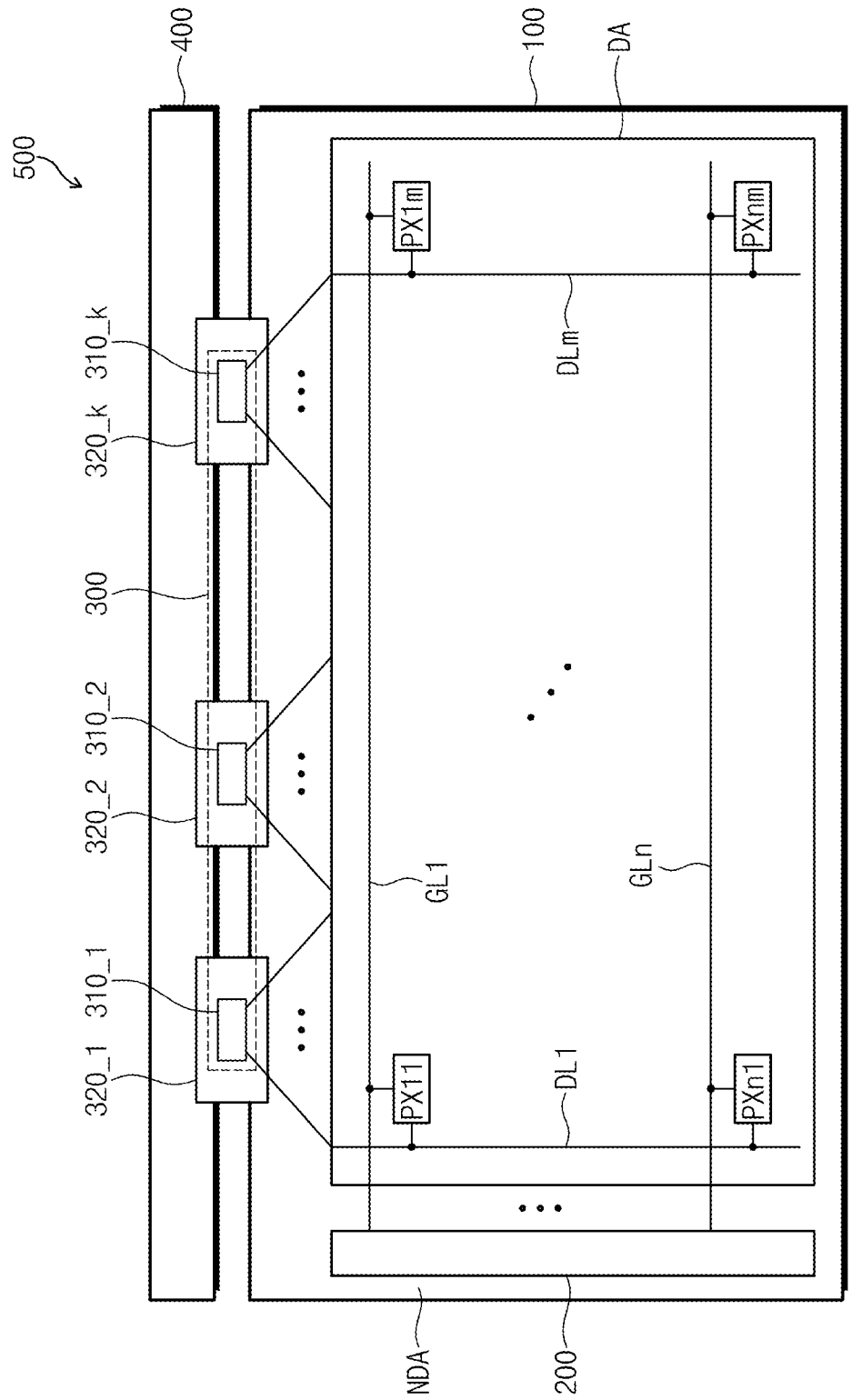
FIG. 1 is a plan view showing a display apparatus according to a first exemplary embodiment of the present disclosure.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the embodiments. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be explained in detail with reference to the accompanying drawings.

FIG. 1 is a plan view showing a display apparatus 500 according to a first exemplary embodiment of the present disclosure.

Referring to FIG. 1, the display apparatus 500 includes a display panel 100, a gate driver 200, a data driver 300, and a driving circuit substrate 400.

The display panel 100 includes a plurality of pixels PX11 to PXnm, a plurality of gate lines GL1 to GLn, and a plurality of data lines DL1 to DLm. The display panel 100 includes a display area DA and a non-display NDA surrounding the display area DA when viewed in a plan view.

The pixels PX11 to PXnm are arranged in a matrix form and disposed in the display area DA. For instance, the pixels PX11 to PXnm are arranged in n rows by m columns crossing each other. In the present exemplary embodiment, each of "m" and "n" is an integer number greater than 0.

The gate lines GL1 to GLn are insulated from the data lines DL1 to DLm while crossing the data lines DL1 to DLm. The gate lines GL1 to GLn are connected to the gate driver 200 to sequentially receive gate signals. The data lines DL1 to DLm are connected to the data driver 300 to receive data voltages in analog form.

Each of the pixels PX11 to PXnm is connected to a corresponding gate line of the gate lines GL1 to GLn and a corresponding data line of the data lines DL1 to DLm. The pixels PX11 to PXnm receive the data voltages through the data lines DL1 to DLm in response to the gate signals applied through the gate lines GL1 to GLn. The pixels PX11 to PXnm display gray scales corresponding to the data voltages.

The gate driver 200 may be disposed in the non-display area NDA disposed adjacent to one side of the display area DA. In detail, the gate driver 200 may be mounted on the non-display area NDA disposed adjacent to a left side of the display area DA in an ASG (amorphous silicon TFT gate driver circuit) manner.

The gate driver 200 generates the gate signals in response to a gate control signal applied from a timing controller (not shown), which is mounted on the driving circuit substrate 400, sometimes called the driving circuit board 400. The gate signals are sequentially applied to the pixels PX11 to PXnm through the gate lines GL1 to GLn in the unit of row. Thus, the pixels PX11 to PXnm are driven in the unit of row.

The data driver 300 receives image signals and a data control signal from the timing controller. The data driver 300 generates the data voltages in analog form, which correspond to the image signals, in response to the data control signal. The data driver 300 applies the data voltages to the pixels PX11 to PXnm through the data lines DL1 to DLm.

The data driver 300 includes a plurality of source driving chips 310_1 to 310_k. "k" is an integer number greater than 0 and smaller than "m". Each of the source driving chips 310_1 to 310_k is mounted on a corresponding flexible circuit board of flexible circuit boards 320_1 to 320_k and connected between the driving circuit board 400 and the non-display area NDA disposed adjacent to an upper side of the display area DA.

In the present exemplary embodiment, the source driving chips 310_1 to 310_k may be mounted on the flexible circuit boards 320_1 to 320_k in a tape carrier package (TCP) manner, but they should not be limited thereto or thereby. That is, the source driving chips 310_1 to 310_k may be mounted on the non-display area NDA disposed adjacent to the upper side of the display area DA in a chip on glass (COG) method.

Figure 2:
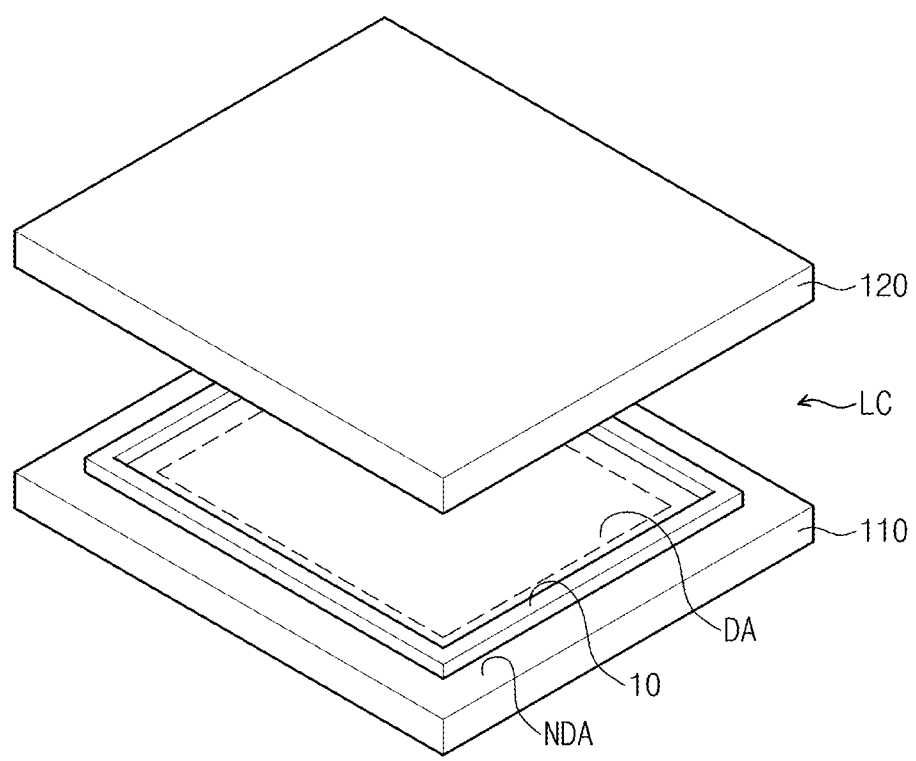
FIG. 2 is a perspective view showing a display panel shown in FIG. 1.
Figure 2:
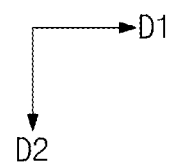

FIG. 2 is a perspective view showing the display panel 100 shown in FIG. 1.

For the convenience of explanation, the gate driver 200 and the data driver 300 are not shown in FIG. 2.

As a representative example, FIG. 2 shows a liquid crystal display panel as the display panel 100, but the display panel 100 should not be limited to the liquid crystal display panel. That is, an electrowetting display panel for an electrowetting display device and an electrophoretic display panel for an electrophoretic display device may be used as the display panel 100.

Referring to FIG. 2, the display panel 100 includes a first substrate 110, a second substrate 120, and a liquid crystal layer LC. The first substrate 110 and the second substrate 120 are disposed to face each other. The liquid crystal layer LC is disposed between the first and second substrates 110 and 120.

When the display apparatus 500 is manufactured, a sealing member 10 is disposed in the non-display area NDA of the first substrate 10 to surround the display area DA. The first and second substrates 110 and 120 are attached to each other by the sealing member 10.

Although not shown in FIG. 2, the gate driver 200 is disposed on the first substrate 110 in the non-display area NDA adjacent to the one side of the display area DA. The data driver 300 is connected to the non-display area NDA adjacent to the upper side of the display area DA.

Figure 3:
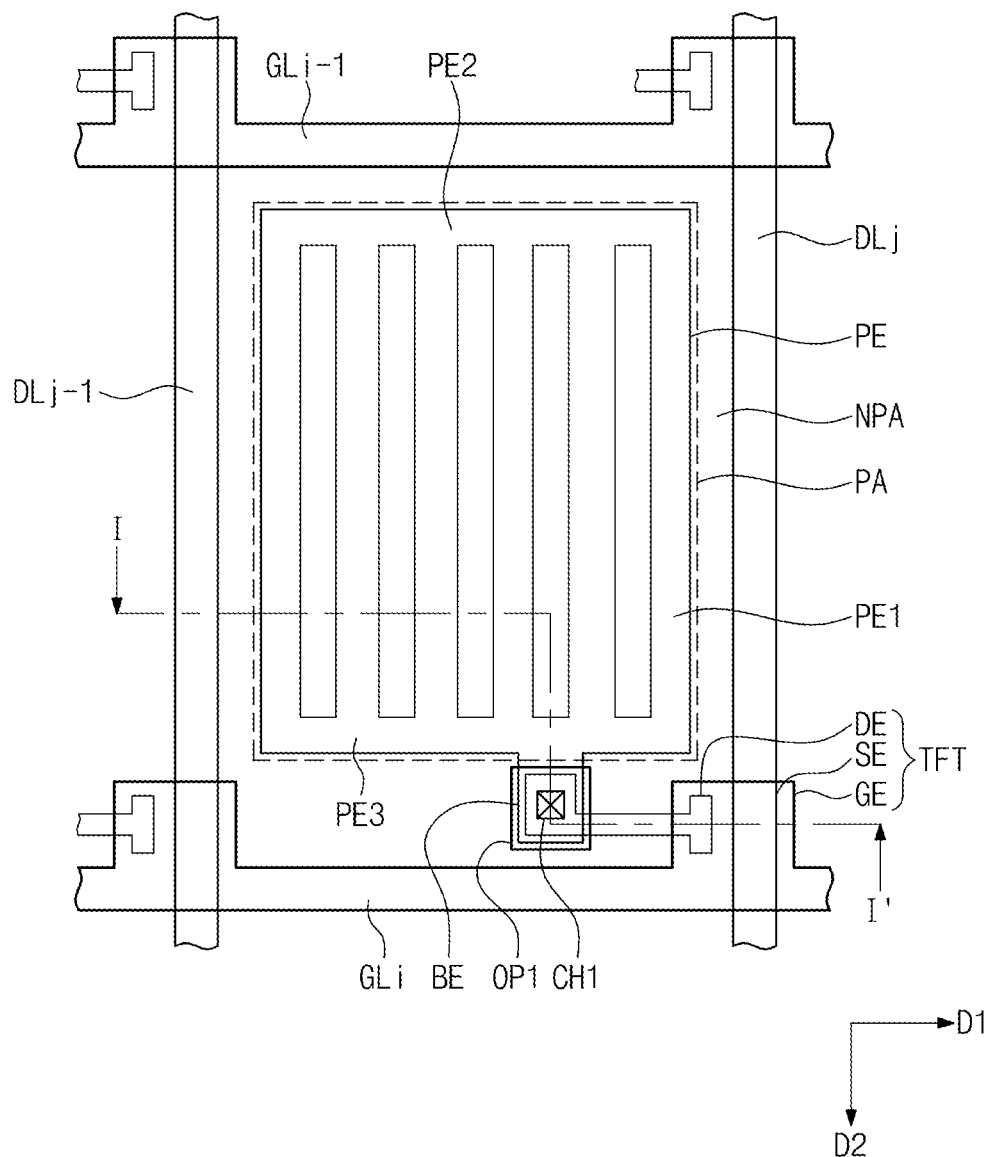
FIG. 3 is a plan view showing a pixel shown in FIG. 1.

FIG. 3 is a plan view showing a pixel shown in FIG. 1.

In the present exemplary embodiment, pixels have the same configuration and function, and thus FIG. 3 shows only one pixel PXij. In addition, hereinafter, for the convenience of explanation, the configuration of the one pixel PXij will be described in detail.

Referring to FIG. 3, the pixel PXij includes a pixel area PA and a non-pixel area NPA surrounding the pixel area PA when viewed in a plan view. The pixel area PA is an area in which the image is displayed, and the non-pixel area NPA is an area in which the image is not displayed.

The non-pixel area NPA is disposed between the pixel areas PA. Thus, the pixels PX11 to PXnm include the pixel areas PA corresponding to the pixels PX11 to PXnm, respectively, and the non-pixel area NPA disposed between the pixel areas PA.

The gate lines GLi-1 and GL1 and the data lines DLj-1 and DLj are disposed in the non-pixel area NPA. The gate lines GLi-1 and GLi extend in a first direction D1. The data lines DLj-1 and DLj extend in a second direction D2 substantially perpendicular to the first direction D1 to cross the gate lines GLi-1 and GLi, and the data lines DLj-1 and DLj are insulated from the gate lines GLi-1 and GLi. "i" is an integer number greater than 0 and smaller than "n". "j" is an integer number greater than 0 and smaller than "m".

The pixel PXij includes a thin film transistor TFT and a pixel electrode PE connected to the thin film transistor TFT. The thin film transistor TFT is disposed in the non-pixel area NPA. The pixel electrode PE is disposed in the pixel area PA. The thin film transistor TFT of the pixel PXij is connected to a corresponding gate line GLi and a corresponding data line DLj.

The thin film transistor TFT includes a gate electrode GE connected to the gate line GLi, a source electrode SE connected to the data line DLj, and a drain electrode DE connected to the pixel electrode PE.

In detail, the thin film transistor TFT includes the gate electrode GE branched from the gate line GLi, the source electrode SE corresponding to a portion of the data line DLj overlapped with the gate electrode GE, and the drain electrode DE disposed on the gate electrode GE to be spaced apart from the source electrode SE. The drain electrode DE extends and is electrically connected to the pixel electrode PE through a first contact hole CH1.

The pixel electrode PE extends to the non-pixel area NPA and is connected to the drain electrode DE of the thin film transistor TFT through the first contact hole CH1. In detail, a branch electrode BE branched from the pixel electrode PE is connected to the drain electrode DE of the thin film transistor TFT through the first contact hole CH1. The branch electrode BE is disposed in the non-pixel area NPA.

The pixel electrode PE includes a plurality of branch portions PE1, a first connection portion PE2, and a second connection portion PE3. The branch portions PE1 extend in the second direction D2 and are spaced apart from each other in regular intervals. The first and second connection portions PE2 and PE3 extend in the first direction D1. The first connection portion PE2 connects one ends of the branch portions PE1 in the second direction D2. The second connection portion PE3 connects the other ends of the branch portions PE1 in the second direction D2.

Although not shown in FIG. 3, a common electrode may be disposed in the pixel PXij. The common electrode includes a first opening OP1. The first opening OP1 has a size greater than a size of the first contact hole CH1 when viewed in a plan view. Details thereof will be described in detail later.

Figure 4:
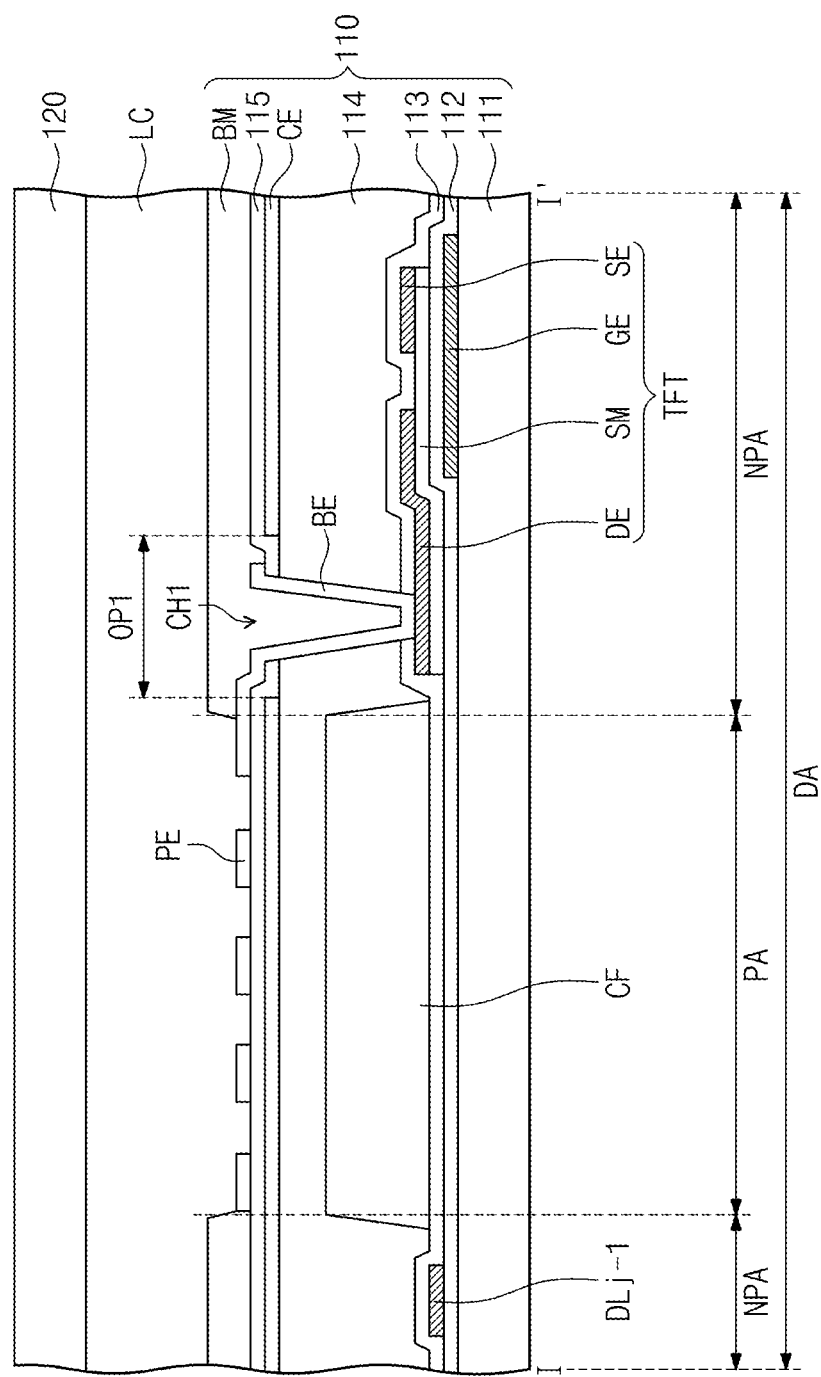
FIG. 4 is a cross-sectional view taken along a line I-I' shown in FIG. 3.

FIG. 4 is a cross-sectional view taken along a line I-I' shown in FIG. 3.

Referring to FIG. 4, the display panel 10 includes the first substrate 110, the second substrate 120 disposed to face the first substrate 110, and the liquid crystal layer LC interposed between the first substrate 110 and the second substrate 120. The first substrate 110 corresponds to a thin film transistor substrate. The pixels PX11 to PXnm are disposed on the first substrate 110.

The first substrate 110 includes a base substrate 111, a thin film transistor TFT, a color filter CF, first, second, and third inorganic insulating layers 112, 113, and 115, an organic insulating layer 114, the common electrode CE, the pixel electrode PE, and a black matrix BM.

Similar to the display panel 100, the base substrate 111 includes the display area DA in which the pixels PX11 to PXnm are disposed and the non-display area NDA surrounding the display area DA when viewed in a plan view. In addition, the display area DA of the base substrate 111 includes the pixel areas PA and the non-pixel area NPA surrounding the pixel areas PA.

The gate electrode GE of the thin film transistor TFT is disposed on the base substrate 111 in the non-pixel area NPA. As described above, the gate electrode GE is branched from the gate line GLi.

The first inorganic insulating layer 112 is disposed on the base substrate 111 in the non-pixel area NPA to cover the gate electrode GE. The first inorganic insulating layer 112 includes an inorganic material. In addition, the first inorganic insulating layer 112 may serve as a gate insulating layer.

A semiconductor layer SM of the thin film transistor TFT is disposed on the first insulating layer 112 in the non-pixel area NPA. A predetermined area of the semiconductor layer SM is disposed to overlap with the gate electrode GE. Although not shown in figures, the semiconductor layer SM includes an active layer and an ohmic contact layer.

The source electrode SE and the drain electrode DE are disposed on the semiconductor layer SM to be spaced apart from each other. As described earlier, the source electrode SE corresponds to the portion of the data line DLj overlapped with the gate electrode GE. The semiconductor layer SM forms a conductive channel between the source electrode SE and the drain electrode DE. The data line DLj-1 is disposed on the first inorganic insulating layer 112 in the non-pixel area NPA.

The second inorganic insulating layer 113 is disposed on the first inorganic insulating layer 112 to cover the source electrode SE, the drain electrode DE, and the data line DLj-1. The second inorganic insulating layer 113 includes an inorganic material. In addition, the second inorganic insulating layer 113 may serve as a passivation layer. The second inorganic insulating layer 113 covers an upper portion of the semiconductor layer SM, which is exposed.

The color filter CF is disposed on the second inorganic insulating layer 113 in the pixel area PA. A side surface of the color filter CF is disposed in a predetermined area of the non-pixel area NPA adjacent to the pixel area PA.

The color filter CF assigns a color to a light passing through the pixel PXij. The color filter CF may be a red color filter, a green color filter, or a blue color filter, and the color filter CF is disposed to correspond to the pixel area PA.

The organic insulating layer 114 is disposed on the second inorganic insulating layer 113 in the display area DA to cover the color filter CF. The organic insulating layer 114 includes an organic material. The color filter CF is disposed between the second inorganic insulating layer 113 and the organic insulating layer 114 in the pixel area PA.

The common electrode CE is disposed on the organic insulating layer 114 in the display area DA. The common electrode CE includes the first opening OP1. The first opening OP1 is disposed in the non-pixel area NPA. The first opening OP1 is an area where the common electrode CE is not formed.

The first opening OP1 of the common electrode CE is disposed to overlap with the first contact hole CH1. When viewed in a plan view, the size of the first opening OP1 is greater than that of the first contact hole CH1.

The common electrode CE may be formed of a transparent conductive material. For instance, the common electrode CE may include a transparent conductive metal oxide, such as indium tin oxide (ITO), indium zinc oxide (IZO), indium tin zinc oxide (ITZO), etc.

The third inorganic insulating layer 115 is disposed on the organic insulating layer 114 to cover the common electrode CE. That is, the common electrode CE is disposed between the organic insulating layer 114 and the third inorganic insulating layer 115. The third inorganic insulating layer 115 includes an inorganic material.

The first contact hole CH1 is formed penetrating through the second inorganic insulating layer 113, the organic insulating layer 114, and the third inorganic insulating layer 115 to extend to and expose the predetermined area of the drain electrode DE of the thin film transistor TFT. The first contact hole CH1 is disposed to overlap with the first opening OP1 of the common electrode CE. In addition, when viewed in a plan view, the size of the first contact hole CH1 is smaller than that of the first opening OP1.

The pixel electrode PE is disposed on the third inorganic insulating layer 115 in the pixel area PA. The third inorganic insulating layer 115 electrically insulates the pixel electrode PE from the common electrode CE. The pixel electrode PE forms an electric field in cooperation with the common electrode CE. The pixel electrode PE is electrically connected to the drain electrode DE of the thin film transistor TFT through the first contact hole CH1.

In detail, the branch electrode BE branched from the pixel electrode PE is electrically connected to the drain electrode DE of the thin film transistor TFT through the first contact hole CH1 in the non-pixel area NPA. Thus, the thin film transistor TFT is electrically connected to the pixel electrode PE.

The first opening OP1 of the common electrode CE is overlapped with the first contact hole CH1, and the size of the first opening OP1 is greater than that of the first contact hole CH1 when viewed in a plan view. Thus, even through the branch electrode BE branched from the pixel electrode PE is connected to the drain electrode DE through the first contact hole CH1, the branch electrode BE may not be electrically shorted with the common electrode CE.

The pixel electrode PE and the branch electrode BE may be formed of a transparent conductive material. For instance, the pixel electrode PE and the branch electrode BE may be formed of a transparent conductive metal oxide, such as indium tin oxide (ITO), indium zinc oxide (IZO), indium tin zinc oxide (ITZO), etc.

The black matrix BM is disposed on the third inorganic insulating layer 115 in the non-pixel area NPA. Thus, the black matrix BM may be disposed on the branch electrode BE disposed in the non-pixel area NPA. A boundary surface of the black matrix BM may be disposed in a boundary area between the pixel area PA and the non-pixel area NPA. The black matrix BM includes an organic material.

The black matrix BM blocks a light that is unnecessary to display the image. The black matrix BM may prevent light leakage caused by malfunction of liquid crystal molecules in edges of the pixel area PA or color mixture occurring at edges of the color filter CF.

The liquid crystal display including the pixel electrode PE and the common electrode CE, which are arranged in the manner as shown in FIGS. 3 and 4, may serve as a plane to line switching (PLS) mode liquid crystal display. In the PLS mode liquid crystal display, a fringe field is formed by the pixel electrode PE applied with the data voltage and the common electrode CE applied with the common voltage.

The liquid crystal molecules of the liquid crystal layer LC are driven by the fringe field in the PLS mode liquid crystal display. A light transmittance of the liquid crystal layer LC is controlled by the liquid crystal molecules driven by the fringe electric field, and thus desired images are displayed.

Figure 5:
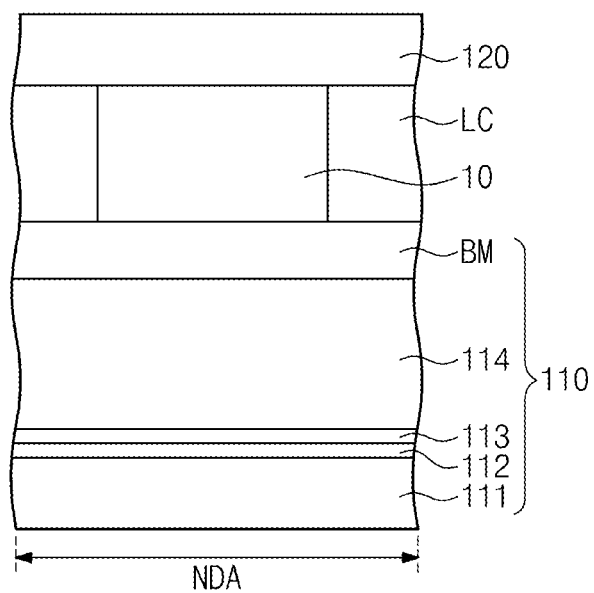
FIG. 5 is a cross-sectional view showing a non-display area in which a sealing member is disposed shown in FIG. 2.

FIG. 5 is a cross-sectional view showing the non-display area in which the sealing member is disposed shown in FIG. 2.

Referring to FIG. 5, the first substrate 110 and the second substrate 120 are attached to each other by the sealing member 10. The first substrate 100 includes the base substrate 111, the inorganic insulating layers 112 and 113, and the organic layers 114 and BM.

The inorganic insulating layers 112 and 113 include the first inorganic insulating layer 112 disposed on the base substrate 111 and the second inorganic insulating layer 113 disposed on the first inorganic insulating layer 112. The organic layers 114 and BM include the organic insulating layer 114 disposed on the second inorganic insulating layer 113 and the black matrix BM disposed on the organic insulating layer 114. The sealing member 10 is disposed on the black matrix BM. The sealing member 10 includes the organic material.

Although not shown in figures, the gate driver 200 includes a plurality of thin film transistors disposed on the base substrate 111. The thin film transistors are connected to each other to generate the gate signals. The thin film transistors of the gate driver 200 are disposed on the same layer as the thin film transistors TFT of the pixels PX11 to PXnm.

The third inorganic insulating layer 115 is not disposed between the black matrix BM and the organic insulating layer 114 in the non-display area NDA of the display apparatus 500 according to the present exemplary embodiment.

However, the third inorganic insulating layer 115 may be disposed between the black matrix BM and the organic insulating layer 114 in the non-display area NDA. When layers formed of different materials make contact with each other, an adhesive force between the layers becomes weaker than that when layers formed of the same material make contact with each other. That is, the adhesive force between the organic material and the inorganic material is weaker than that between the organic material and the organic material.

The black matrix BM formed of the organic material makes contact with the third inorganic insulating layer 115 formed of the inorganic material, the black matrix BM and the third inorganic insulating layer 115 can be separated from each other since the adhesive force between the black matrix BM and the third inorganic insulating layer 115 becomes weak. In addition, the third inorganic insulating layer 115 and the organic insulating layer 114 may be separated from each other. That is, the separation occurs in the area adjacent to a lower portion of the sealing member 10. In this case, moisture may enter into the display apparatus 500 through a space caused by the separation phenomenon.

Due to the moisture, characteristics of wirings, e.g., gate and data lines, and devices, e.g., thin film transistors, of the display apparatus 500 may be deteriorated. In addition, a peel strength (or an adhesive force) between the first substrate 110 and the second substrate 120 becomes weak by the space caused by the separation phenomenon. As a result, reliability of the display apparatus 500 is lowered.

According to the present exemplary embodiment, however, the third inorganic insulating layer 115 is not disposed between the black matrix BM and the organic insulating layer 114 in the non-display area NDA of the display apparatus 500. Therefore, the black matrix BM and the organic insulating layer 114 make contact with each other. In addition, the black matrix BM and the sealing member 10 make contact with each other.

As described above, since the organic insulating layer 114, the black matrix BM, and the sealing member 10 make contact with each other in the present exemplary embodiment, the adhesive force therebetween becomes strong. As a result, the separation phenomenon may be prevented from occurring, the moisture may be prevented from entering into the display apparatus 500, and the peel strength between the first substrate 110 and the second substrate 120 may be prevented from being lowered.

Consequently, the display apparatus 500 according to the present exemplary embodiment may have improved reliability.

FIGS. 6A to 6F are cross-sectional views showing a manufacturing method of the display apparatus according to the first exemplary embodiment of the present disclosure.

For the convenience of explanation, FIGS. 6A to 6F show the manufacturing method of the thin film transistor substrate with reference to the cross-sectional view of the display area DA shown in FIG. 4 and the cross-sectional view of the non-display area NDA shown in FIG. 5.

Figure 6A:
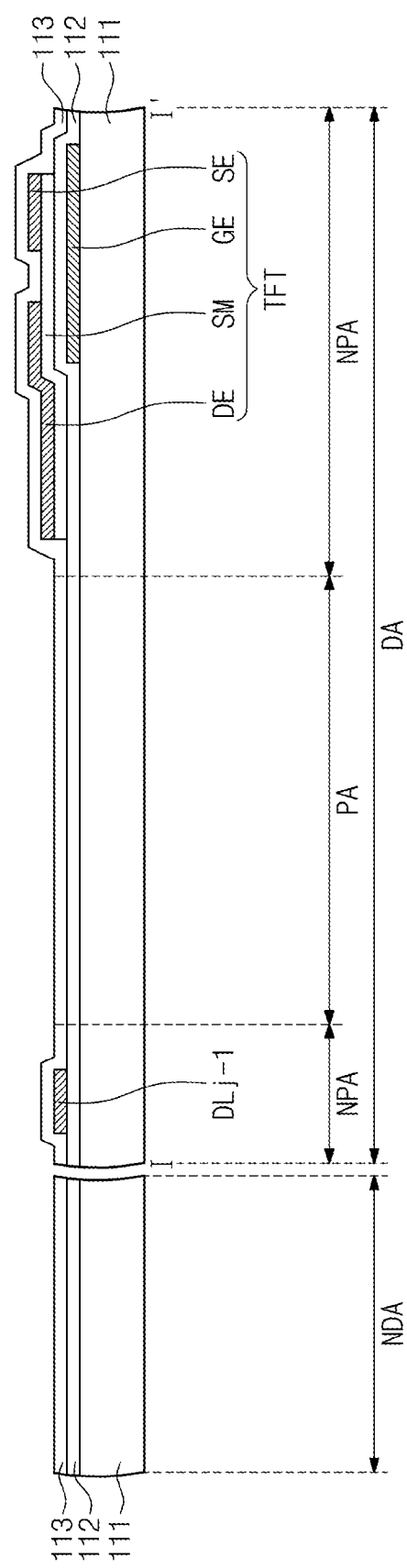
FIGS. 6A, 6B, 6C, 6D, 6E, 6F are cross-sectional views showing a manufacturing method of the display apparatus according to the first exemplary embodiment.

Referring to FIG. 6A, the thin film transistor TFT is formed on the base substrate 111 in the display area DA. The second inorganic insulating layer 113 is formed on the base substrate 111 to cover the thin film transistor TFT.

The first inorganic insulating layer 112 is formed on the base substrate 111 in the non-display area DA. The second inorganic insulating layer 113 is formed on the first inorganic insulating layer 112 in the non-display area NDA.

Figure 6B:
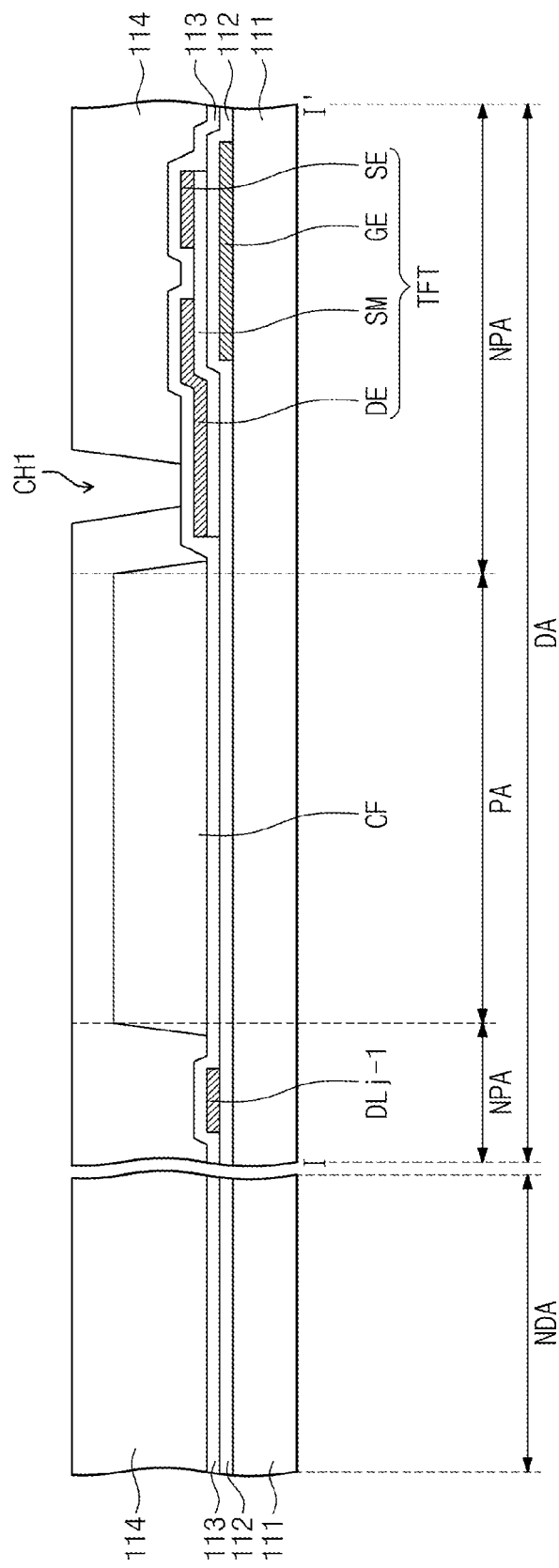

Referring to FIG. 6B, the color filter CF is formed on the second inorganic insulating layer 113 in the pixel area PA of the display area DA. The side surface of the color filter CF is disposed in the predetermined area of the non-pixel area NPA adjacent to the pixel area PA.

The organic insulating layer 114 is formed in the display area DA to cover the color filter CF. The organic insulating layer 114 is removed in an area corresponding to the first contact hole CH1. The organic insulating layer 114 is formed on the second inorganic insulating layer 113 in the non-display area NDA.

Figure 6C:
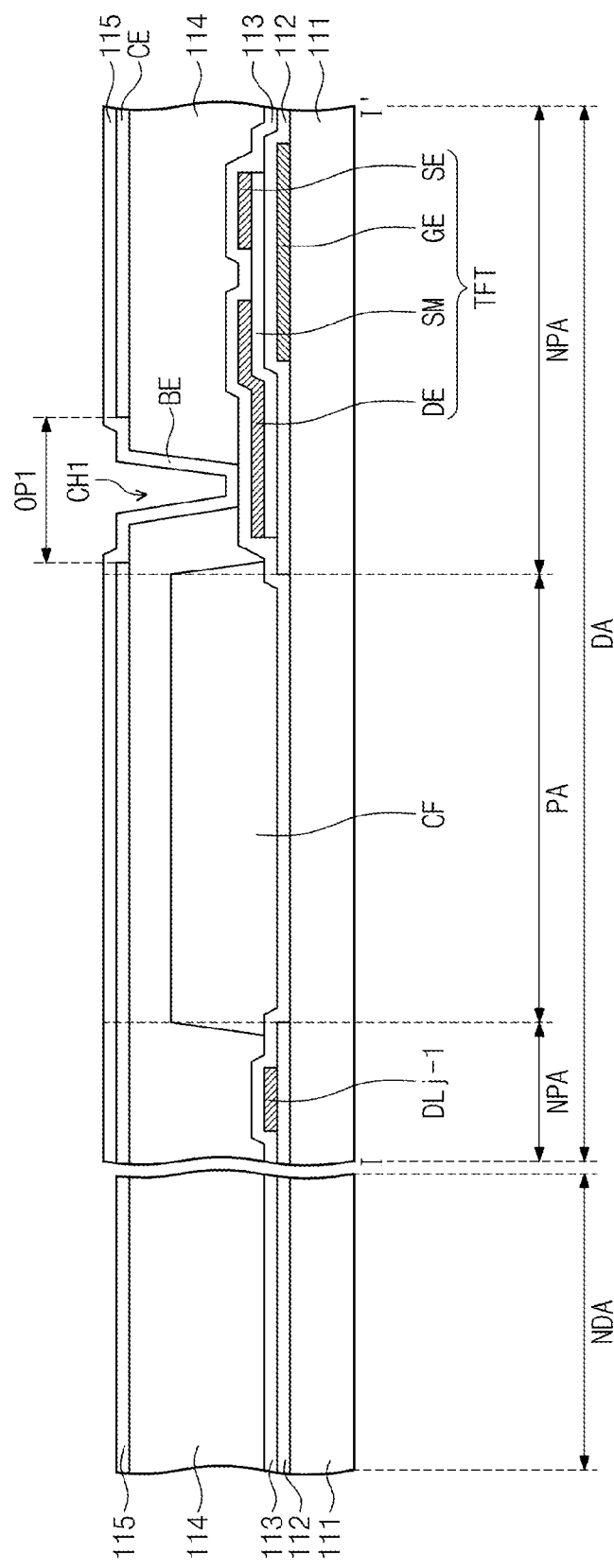

Referring to FIG. 6C, the common electrode CE is formed on the organic insulating layer 114 in the display area DA. The common electrode CE includes the first opening OP1 formed therethrough. The size of the first opening OP1 of the common electrode CE is greater than that of the first contact hole CH1 when viewed in a plan view.

The third inorganic insulating layer 115 is formed on the organic insulating layer 114 to cover the common electrode CE in the display area DA. In addition, the third inorganic insulating layer 115 is formed on the second inorganic insulating layer 113 and on the side surface of the organic insulating layer 114 in the area corresponding to the first contact hole CH1.

The third inorganic insulating layer 115 is formed on the organic insulating layer 114 in the non-display area NDA.

Figure 6D:
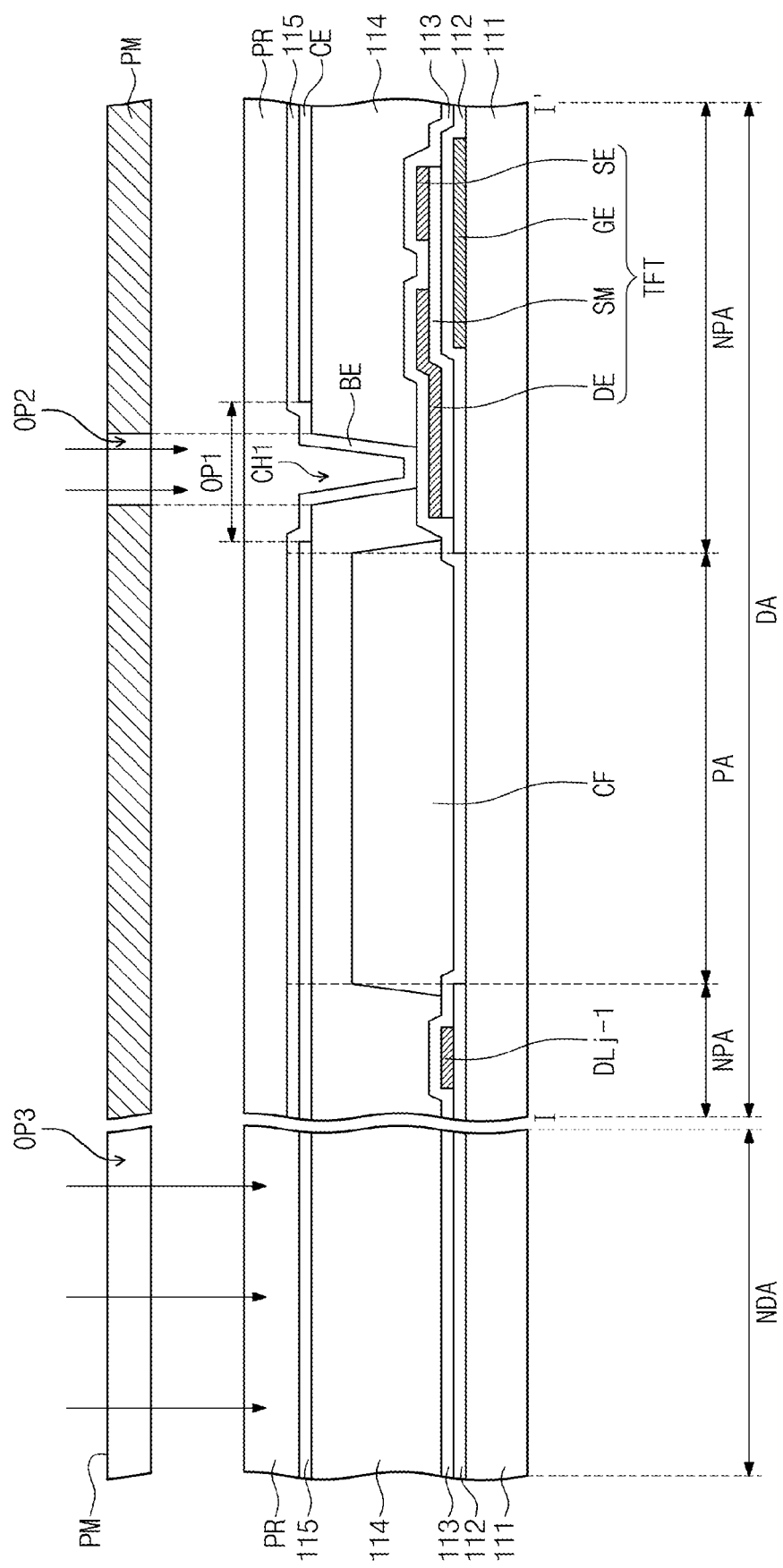

Referring to FIG. 6D, a photosensitive resin PR (or photoresist) is formed on the third inorganic insulating layer 115 in the display area DA and the non-display area NDA. A photo mask PM is disposed on the photosensitive resin PR. The photo mask PM includes a second opening OP2 corresponding to the first contact hole CH1 and a third opening OP3 corresponding to the non-display area NDA.

When the photo mask PM is disposed on the photosensitive resin PR, the photosensitive resin PR is exposed and developed. The photosensitive resin PR is removed in the area corresponding to the first contact hole CH1 in the display area DA and removed in the non-display area NDA. Accordingly, the third inorganic insulating layer 115 is exposed in the area corresponding to the first contact hole CH1. In addition, the third inorganic insulating layer 115 is exposed in the non-display area NDA.

The third inorganic insulating layer 115 and the second inorganic insulating layer 113 are etched using the photosensitive resin PR remaining in the display area DA as a mask. The third inorganic insulating layer 115 is etched in the non-display area NDA. Then, the photosensitive resin PR is removed.

Figure 6E:
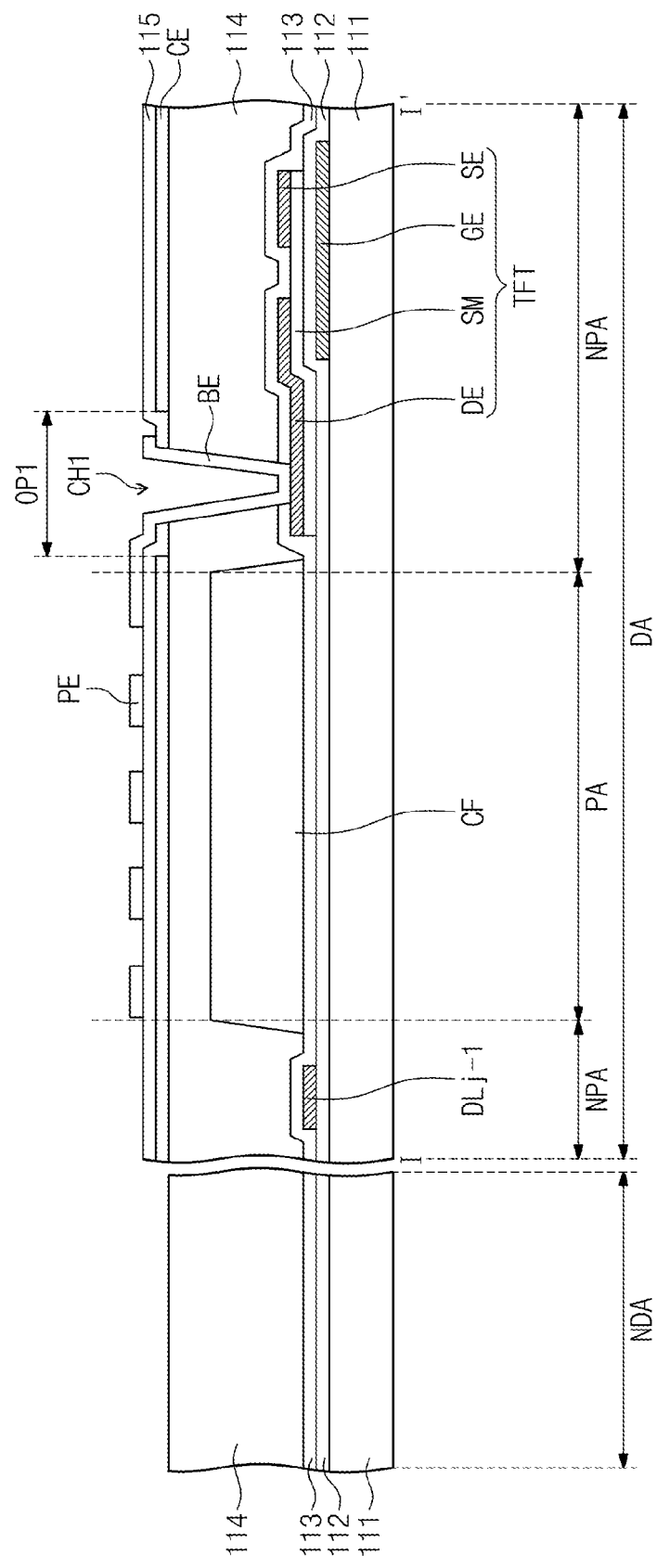

Referring to FIG. 6E, the third inorganic insulating layer 115 and the second inorganic insulating layer 113 are removed in the area corresponding to the first contact hole CH1, and thus the first contact hole CH1 is formed. Therefore, the predetermined area of the drain electrode DE of the thin film transistor TFT is exposed through the first contact hole CH1.

The pixel electrode PE is formed on the third inorganic insulating layer 115 in the pixel area PA. The third inorganic insulating layer 115 electrically insulates the pixel electrode PE from the common electrode CE. The branch electrode BE branched from the pixel electrode PE is electrically connected to the drain electrode DE of the thin film transistor TFT through the first contact hole CH1 in the non-pixel area NPA.

The size of the first opening OP1 of the common electrode CE is greater than the size of the first contact hole CH1 when viewed in a plan view. Thus, even though the branch electrode BE branched from the pixel electrode PE is connected to the drain electrode DE through the first contact hole CH1, the branch electrode BE may not be electrically shorted with the common electrode CE.

The third inorganic insulating layer 115 is removed in the non-display area NDA. Accordingly, the third inorganic insulating layer 115 is not disposed on the organic insulating layer 114 in the non-display area NDA.

Figure 6F:
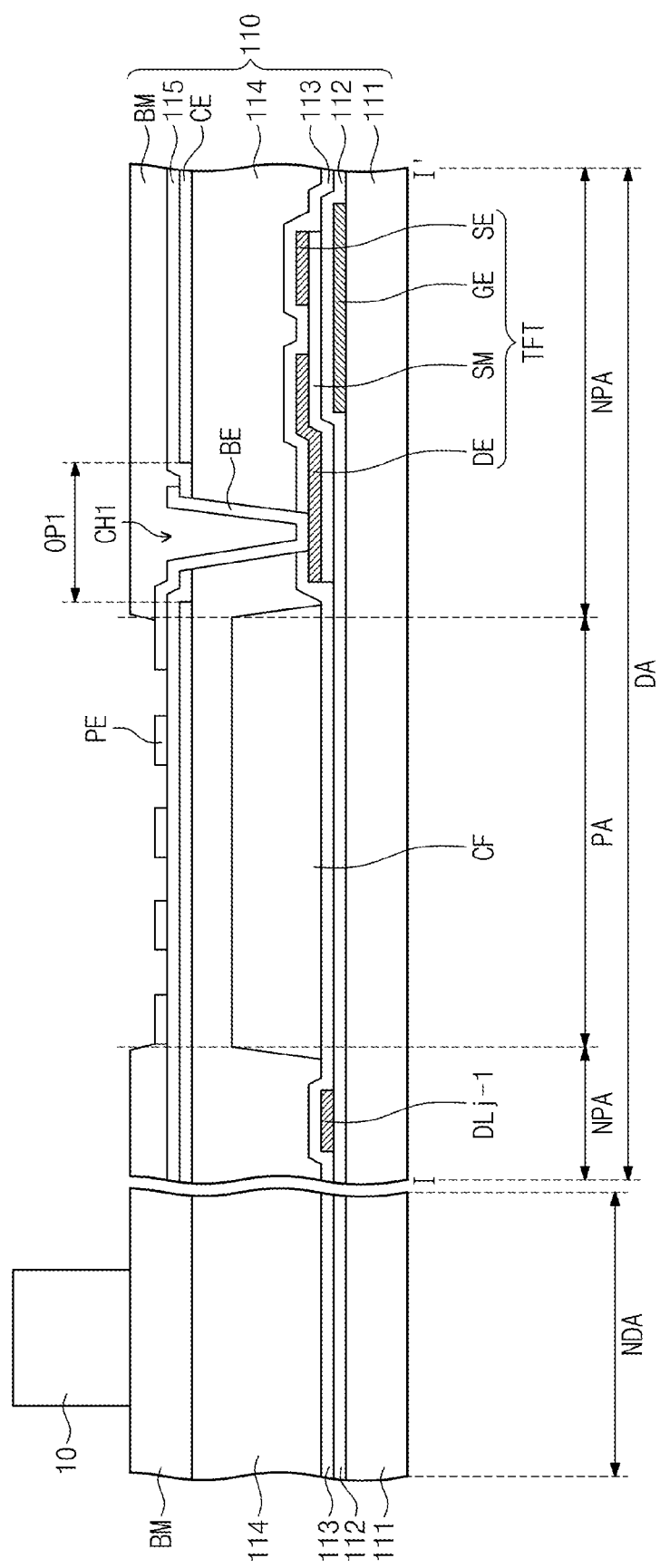

Referring to FIG. 6F, the black matrix BM is formed on the third inorganic insulating layer 115 in the non-pixel area NPA. The black matrix BM is disposed on the organic insulating layer 114 in the non-display area NDA. The sealing member 10 is formed on the black matrix BM in the non-display area NDA. Although not shown in figures, the first substrate 110 and the second substrate 120 are attached to each other by the sealing member 10.

As described above, the organic insulating layer 114, the black matrix BM, and the sealing member 10 make contact with each other, which are formed of the organic material, and thus the adhesive force therebetween becomes strong. As a result, the separation phenomenon may be prevented from occurring, the moisture may be prevented from entering into the display apparatus 500, and the peel strength between the first substrate 110 and the second substrate 120 may be prevented from being lowered.

Consequently, the display apparatus 500 according to the present exemplary embodiment may have improved reliability.

Figure 7:
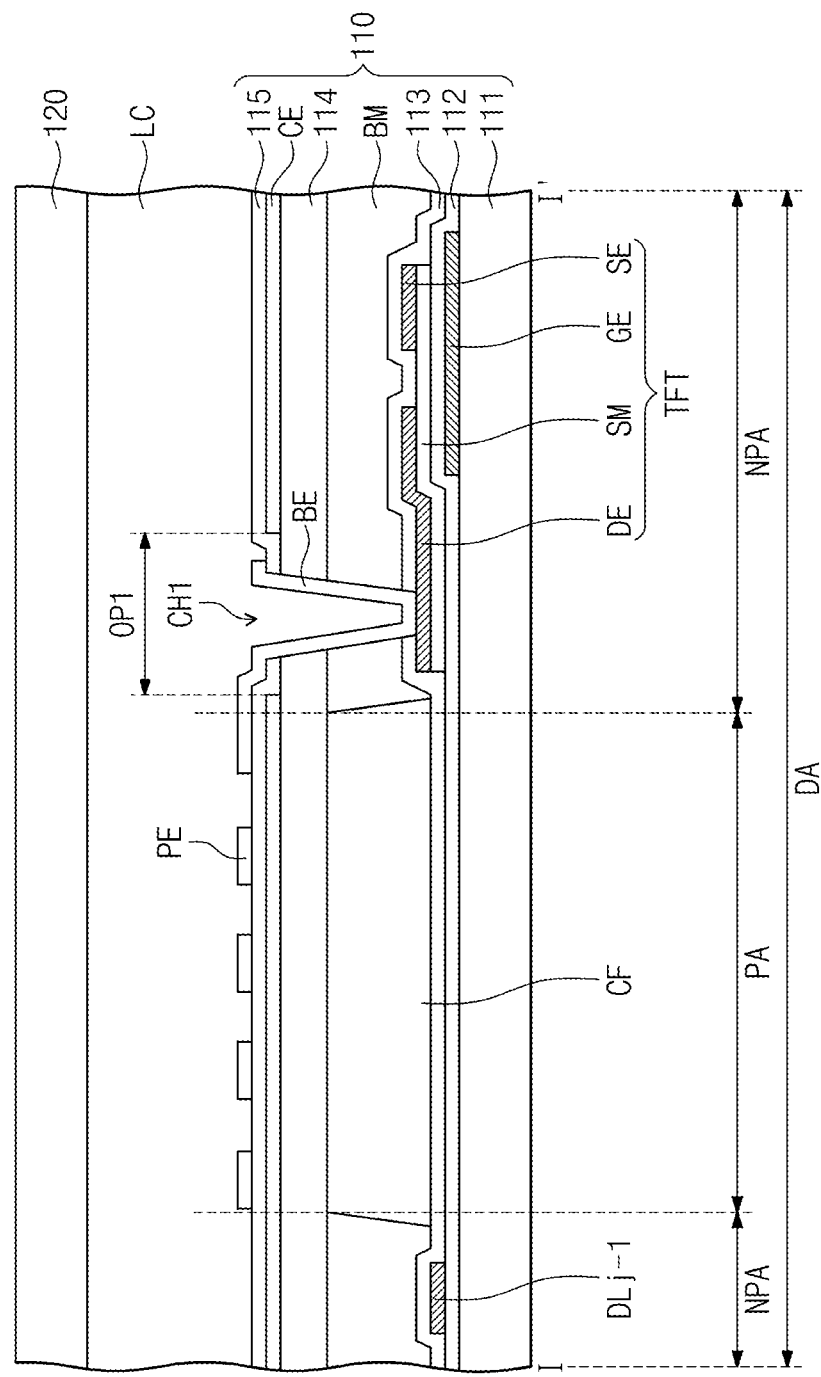
FIG. 7 is a cross-sectional view showing a pixel of a display apparatus according to a second exemplary embodiment.
Figure 8:
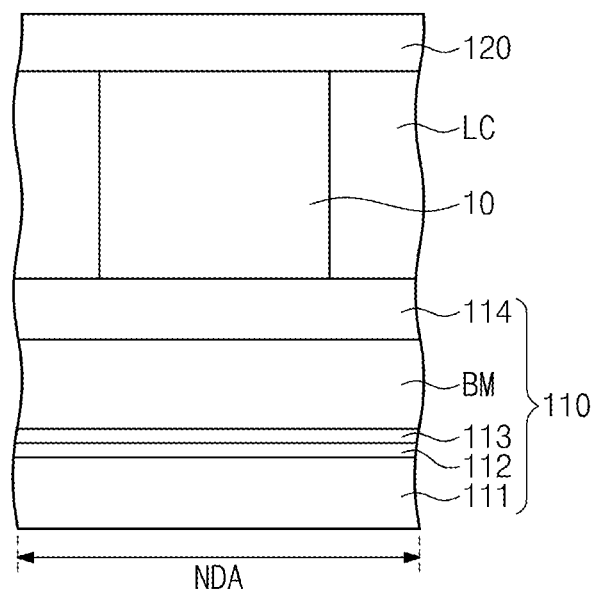
FIG. 8 is a cross-sectional view showing a non-display area of the display apparatus according to the second exemplary embodiment.

FIG. 7 is a cross-sectional view showing a pixel of a display apparatus according to a second exemplary embodiment of the present disclosure and FIG. 8 is a cross-sectional view showing a non-display area of the display apparatus according to the second exemplary embodiment of the present disclosure.

The display apparatus shown in FIGS. 7 and 8 has the same structure and function as those of the display apparatus 500 according to the first exemplary embodiment except for the black matrix BM and the organic insulating layer 114. Therefore, hereinafter different features according to the second exemplary embodiment will mainly be described in detail.

Referring to FIG. 7, the second inorganic insulating layer 113 is disposed on the color filter CF in the pixel area PA of the display area DA. The side surface of the color filter CF is disposed in the predetermined area of the non-pixel area NPA adjacent to the pixel area PA.

The black matrix BM is disposed on the second inorganic insulating layer 113 in the non-pixel area NPA of the display area DA. The organic insulating layer 114 is disposed on the color filter CF and the black matrix BM.

The common electrode CE is disposed on the organic insulating layer 114. The common electrode CE includes the first opening OP1 disposed to overlap with the first contact hole CH1. The first opening OP1 has the size greater than the size of the first contact hole CH1.

The third inorganic insulating layer 115 is disposed on the organic insulating layer 114 to cover the common electrode CE. The first contact hole CH1 is formed through the second inorganic insulating layer 113, the black matrix BM, the organic insulating layer 114, and the third inorganic insulating layer 115 to extend to and expose the predetermined area of the drain electrode DE.

The pixel electrode PE is disposed on the third inorganic insulating layer 115 in the pixel area PA. The branch electrode BE branched from the pixel electrode PE is electrically connected to the drain electrode DE of the thin film transistor TFT through the first contact hole CH1 in the non-pixel area NPA.

Referring to FIG. 8, the black matrix BM is disposed on the second inorganic insulating layer 113 in the non-display area NDA. The organic insulating layer 114 is disposed on the black matrix BM in the non-display area NDA and the sealing member 10 is disposed on the organic insulating layer 114 in the non-display area NDA. The third inorganic insulating layer 115 is not disposed on the organic insulating layer 114 in the non-display area NDA.

However, the third inorganic insulating layer 115 may be disposed on the organic insulating layer 114 in the non-display area NDA. In this case, the sealing member 10 is disposed on the third inorganic insulating layer 115.

Thus, the sealing member 10 formed of the organic material makes contact with the third inorganic insulating layer 115 formed of the inorganic material, the sealing member 10 and the third inorganic insulating layer 115 can be separated from each other since the adhesive force between the sealing member 10 and the third inorganic insulating layer 115 becomes weak. In addition, the third inorganic insulating layer 115 and the organic insulating layer 114 may be separated from each other. In this case, the reliability of the display apparatus is deteriorated.

According to the second exemplary embodiment, however the third inorganic insulating layer 115 is not disposed on the organic insulating layer 114 in the non-display area NDA. Accordingly, the organic insulating layer 114 makes contact with the sealing member 10.

In other words, the black matrix BM, the organic insulating layer 114, and the sealing member 10, which are formed of the organic material, make contact with each other. As a result, the separation phenomenon may be prevented from occurring, the moisture may be prevented from entering, and the peel strength between the first substrate 110 and the second substrate 120 may be prevented from being lowered.

Consequently, the display apparatus according to the second exemplary embodiment may have improved reliability.

FIGS. 9A to 9E are cross-sectional views showing a manufacturing method of the display apparatus according to the second exemplary embodiment of the present disclosure.

Hereinafter, different features according to the second exemplary embodiment will mainly be described in detail.

Figure 9A:
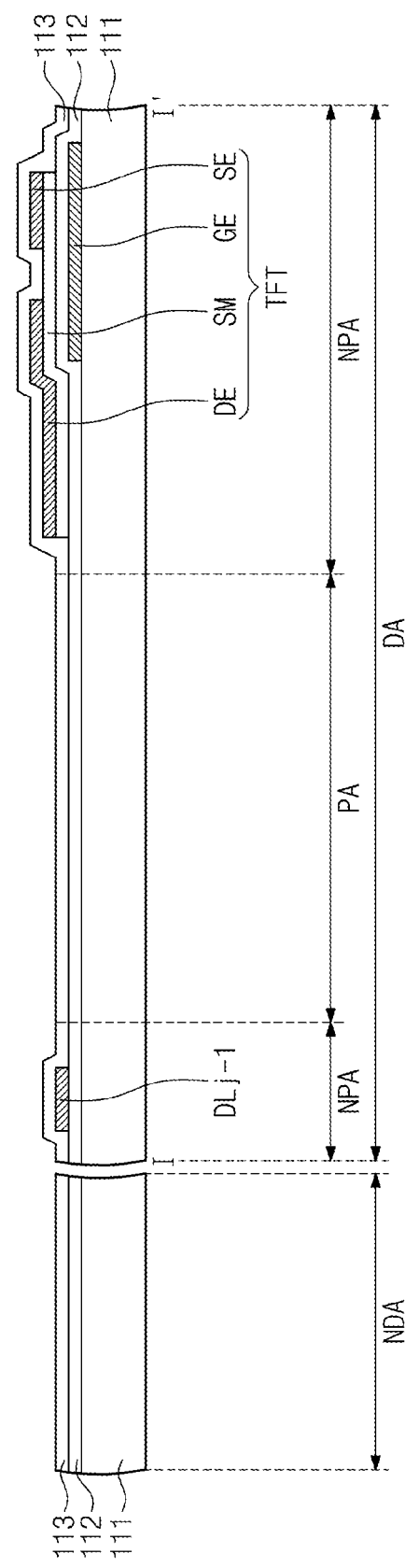

The process shown in FIG. 9A is substantially the same as that shown in FIG. 6A, and thus description thereof will be omitted.

Figure 9B:
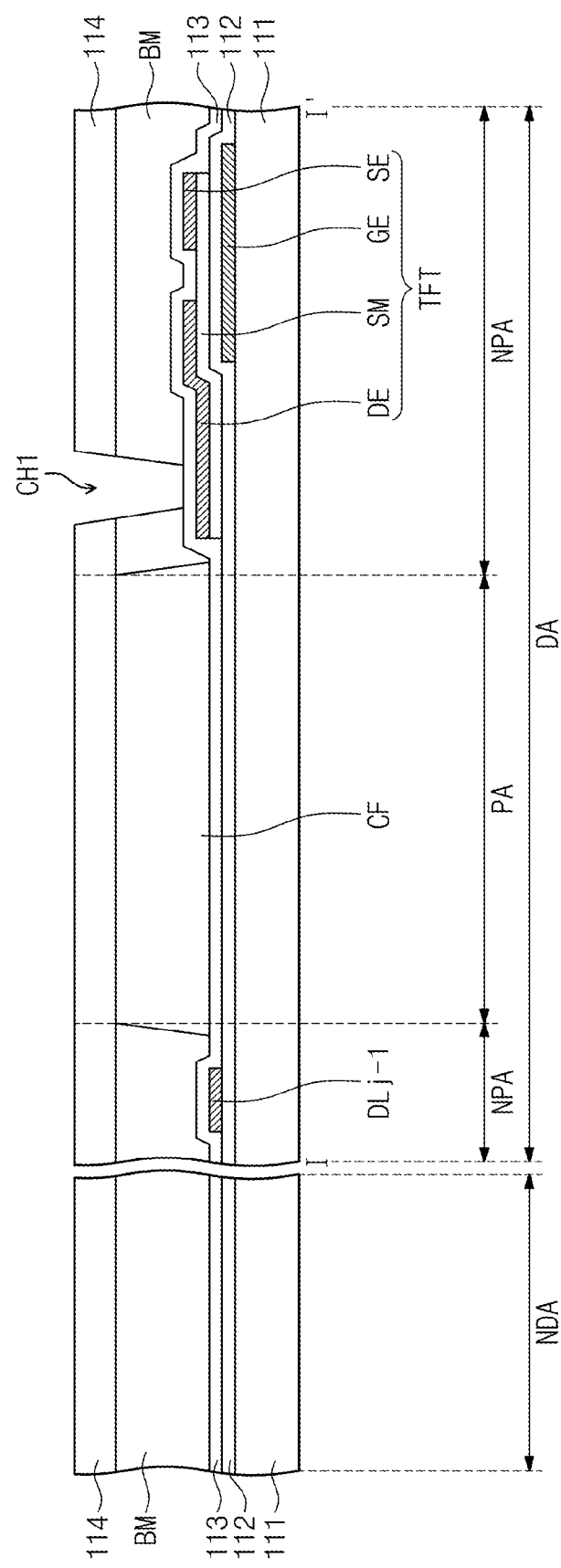

Referring to FIG. 9B, the color filter CF is formed on the second inorganic insulating layer 113 in the pixel area PA of the display area DA. The side surface of the color filter CF is disposed in the predetermined area of the non-pixel area NPA adjacent to the pixel area PA.

The black matrix BM is formed on the second inorganic insulating layer 113 in the non-pixel area NPA of the display area. The organic insulating layer 114 is formed on the color filter CF and the black matrix BM. The black matrix BM and the organic insulating layer 114 are removed from the area corresponding to the first contact hole CH1.

The black matrix BM is formed on the second inorganic insulating layer 113 in the non-display area NDA. The organic insulating layer 114 is formed on the black matrix BM.

Figure 9C:
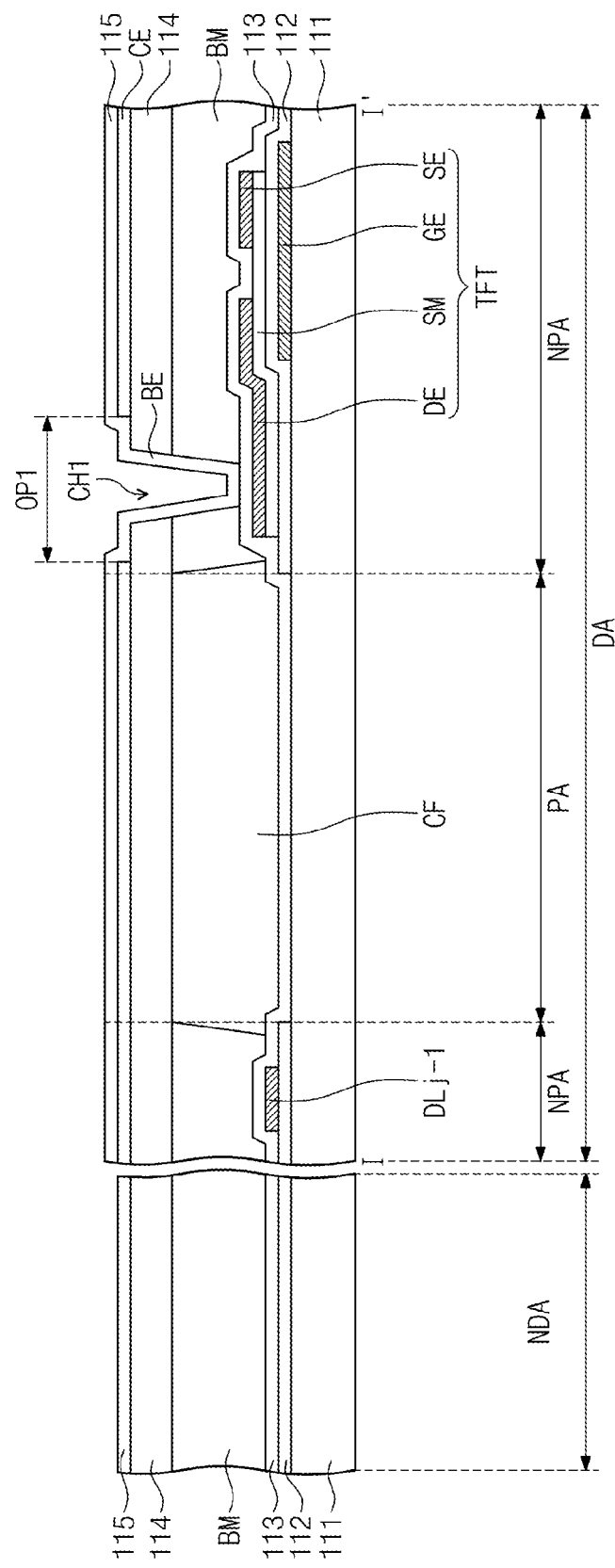

Referring to FIG. 9C, the common electrode CE through which the first opening OP1 is formed is formed on the organic insulating layer 114 in the display area DA.

The third inorganic insulating layer 115 is disposed on the organic insulating layer 114 to cover the common electrode CE in the display area DA. The third inorganic insulating layer 115 is formed on the second inorganic insulating layer 113 and on the side surface of the organic insulating layer 114 in the area corresponding to the first contact hole CH1.

The third inorganic insulating layer 115 is formed on the organic insulating layer 114 in the non-display area NDA.

Referring to FIG. 9D, the photosensitive resin PR is formed on the third inorganic insulating layer 115 in the display area DA and the non-display area NDA. The photo mask PM is disposed above the photosensitive resin PR. The exposure and development process of the photosensitive resin PR using the photo mask PM and the etch process of the second and third inorganic insulating layers 113 and 115 are substantially the same as those shown in FIG. 6D.

Figure 9E:
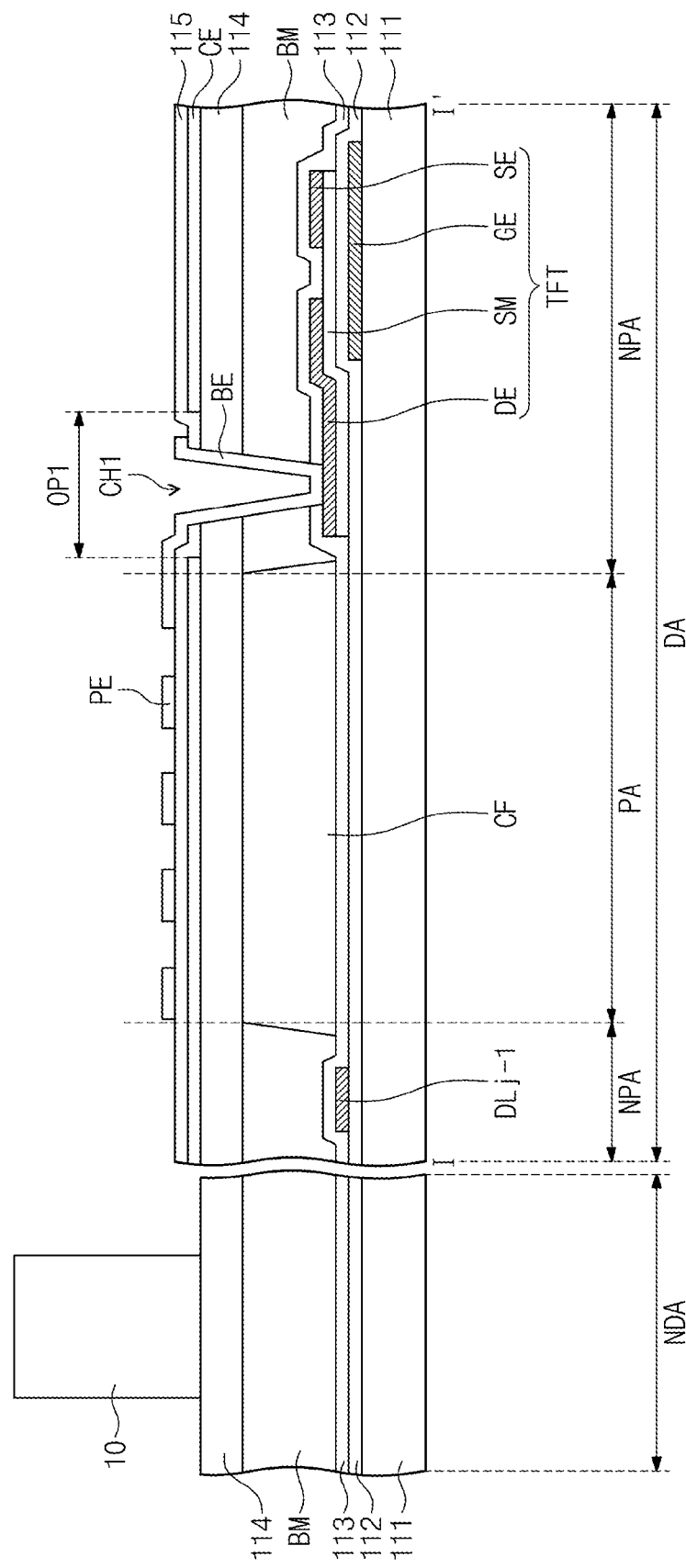

Referring to FIG. 9E, the third inorganic insulating layer 115 and the second inorganic insulating layer 113 are removed from the area corresponding to the first contact hole CH1, and thus the first contact hole CH1 is formed.

The pixel electrode PE is formed on the third inorganic insulating layer 115 in the pixel area PA. The branch electrode BE branched from the pixel electrode PE is electrically connected to the drain electrode DE of the thin film transistor TFT through the first contact hole CH1 in the non-pixel area NPA.

The third inorganic insulating layer 115 is removed in the non-display area NDA. Therefore, the third inorganic insulating layer 115 is not disposed on the organic insulating layer 114 in the non-display area NDA. The sealing member 10 is formed on the organic insulating layer 114 in the non-display area NDA. Although not shown in figures, the first substrate 110 and the second substrate 120 are attached to each other by the sealing member 10.

As described above, the black matrix BM, the organic insulating layer 114, and the sealing member 10, which are formed of the organic material, make contact with each other. As a result, the separation phenomenon may be prevented from occurring, the moisture may be prevented from entering, and the peel strength between the first substrate 110 and the second substrate 120 may be prevented from being lowered.

Consequently, the display apparatus according to the second exemplary embodiment may have improved reliability.

Figure 10:
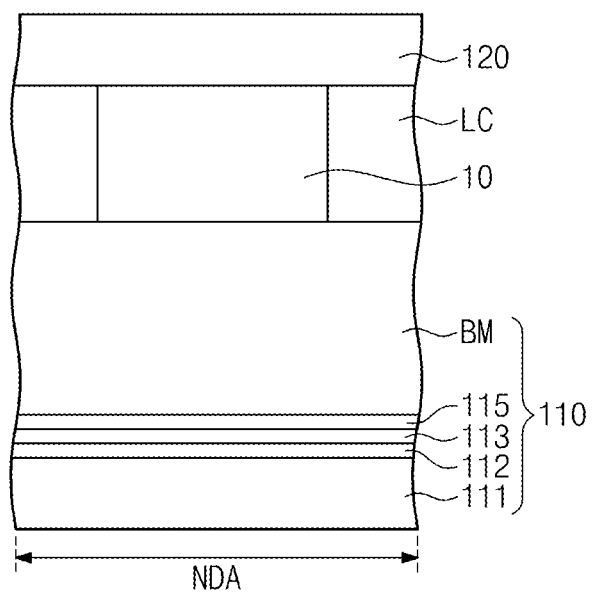
FIG. 10 is a cross-sectional view showing a non-display area of a display apparatus according to a third exemplary embodiment.

FIG. 10 is a cross-sectional view showing a non-display area of a display apparatus according to a third exemplary embodiment.

In the third exemplary embodiment, the cross-sectional view of the pixel of the display apparatus is substantially the same as the cross-sectional view of the pixel of the display apparatus shown in FIG. 4 according to the first exemplary embodiment. Thus, the cross-sectional view of the pixel of the display apparatus according to the third exemplary embodiment has been omitted.

In the third exemplary embodiment, the display apparatus has the same structure and function as those of the display apparatus 500 according to the first exemplary embodiment except for arrangements of the third inorganic insulating layer 115, the black matrix BM, and the organic insulating layer 114. Thus, hereinafter different features according to the third exemplary embodiment will mainly be described in detail.

Referring to FIG. 10, the third inorganic insulating layer 115 is disposed on the second inorganic insulating layer 113 in the non-display area NDA. The black matrix BM is disposed on the third inorganic insulating layer 115. The sealing member 10 is disposed on the black matrix BM.

In the non-display area NDA of the display apparatus according to the third exemplary embodiment, the organic insulating layer 114 is not disposed.

When the organic insulating layer 114 is disposed on the second inorganic insulating layer 113 in the non-display area NDA, the third inorganic insulating layer 115 is disposed on the organic insulating layer 114. That is, the third inorganic insulating layer 115 is disposed between the black matrix BM and the organic insulating layer 114 in the non-display area NDA. Accordingly, the separation phenomenon can occur between the black matrix BM and the third inorganic insulating layer 115 and between the third inorganic insulating layer 115 and the organic insulating layer 114.

According to the display apparatus of the third exemplary embodiment, however, the organic insulating layer 114 is not disposed on the second inorganic insulating layer 113 in the non-display area NDA. Therefore, the black matrix BM and the sealing member 10 make contact with each other.

Since the black matrix BM and the sealing member 10, which are formed of the organic material, make contact with each other, the adhesive force therebetween becomes strong. As a result, the separation phenomenon may be prevented from occurring, the moisture may be prevented from entering into the display apparatus, and the peel strength between the first substrate 110 and the second substrate 120 may be prevented from being lowered.

Consequently, the display apparatus according to the present exemplary embodiment may have improved reliability.

FIGS. 11A to 11F are cross-sectional views showing a manufacturing method of the display apparatus according to the third exemplary embodiment of the present disclosure.

Hereinafter, different features according to the third exemplary embodiment will mainly be described in detail.

Figure 11A:
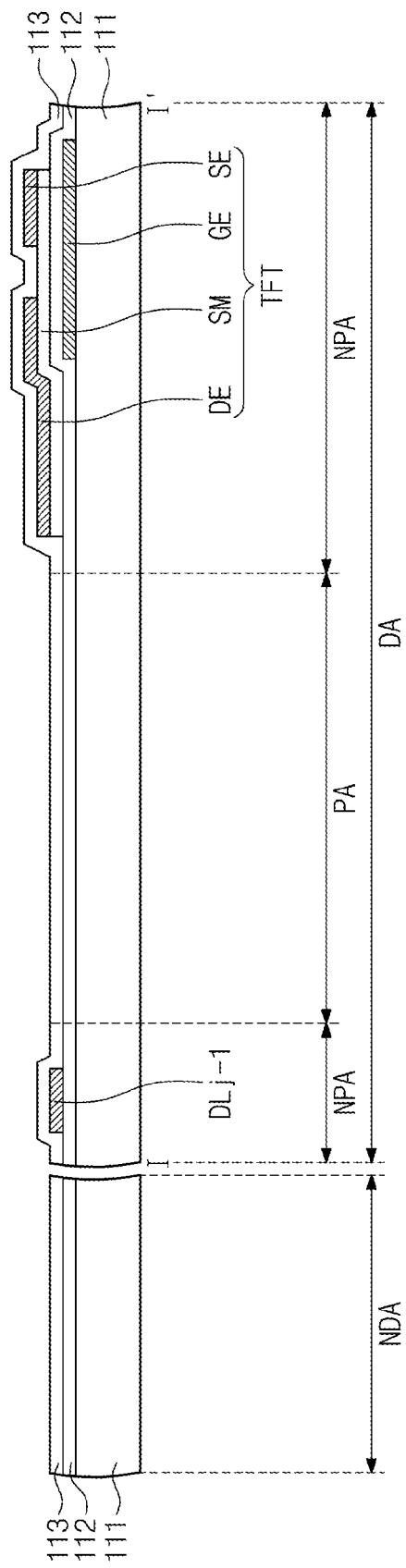

The process shown in FIG. 11A is substantially the same as that shown in FIG. 6A, and thus description thereof will be omitted.

Figure 11B:
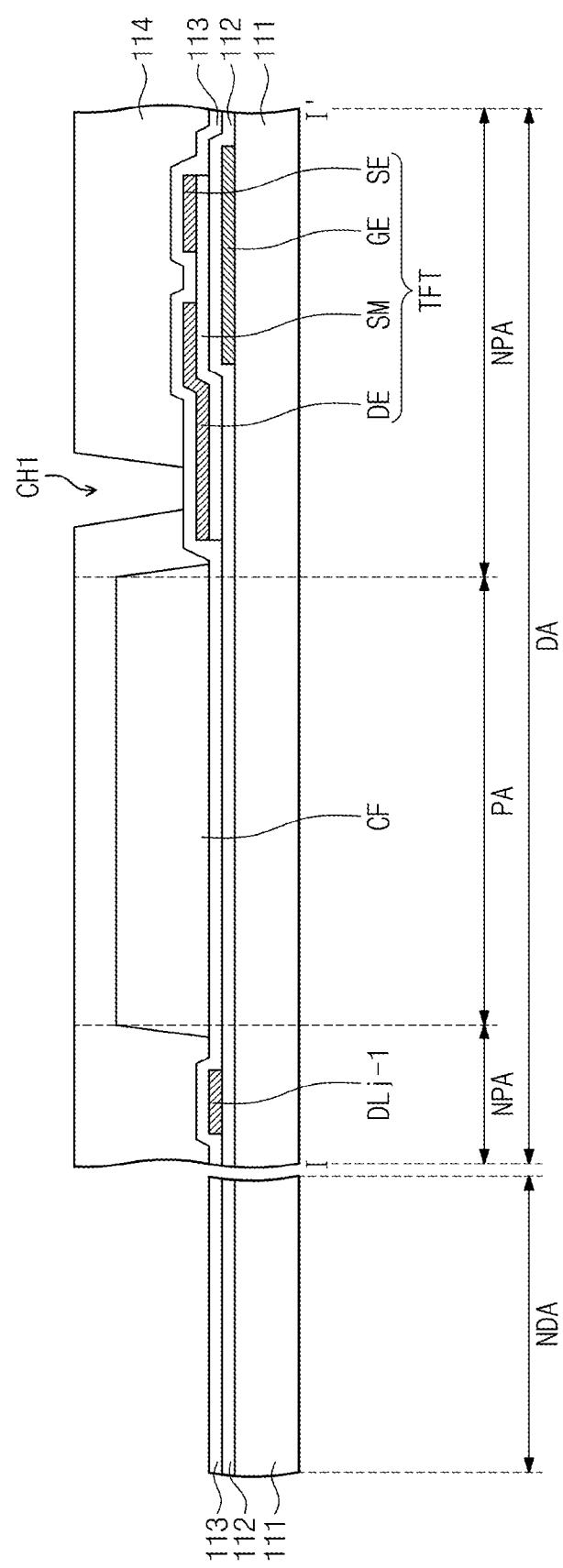

Referring to FIG. 11B, the color filter CF is formed on the second inorganic insulating layer 113 in the pixel area PA. The organic insulating layer 114 is formed in the display area DA to cover the color filter CF. The organic insulating layer 114 is removed from the area corresponding to the first contact hole CH1.

The organic insulating layer 114 is not formed in the non-display area NDA. Although not shown in figures, the organic insulating layer 114 is formed in the display area DA and the non-display area NDA. Then, the organic insulating layer 114 formed in the non-display area NDA is removed when the organic insulating layer 114 is removed from the area corresponding to the first contact hole CH1.

Figure 11C:
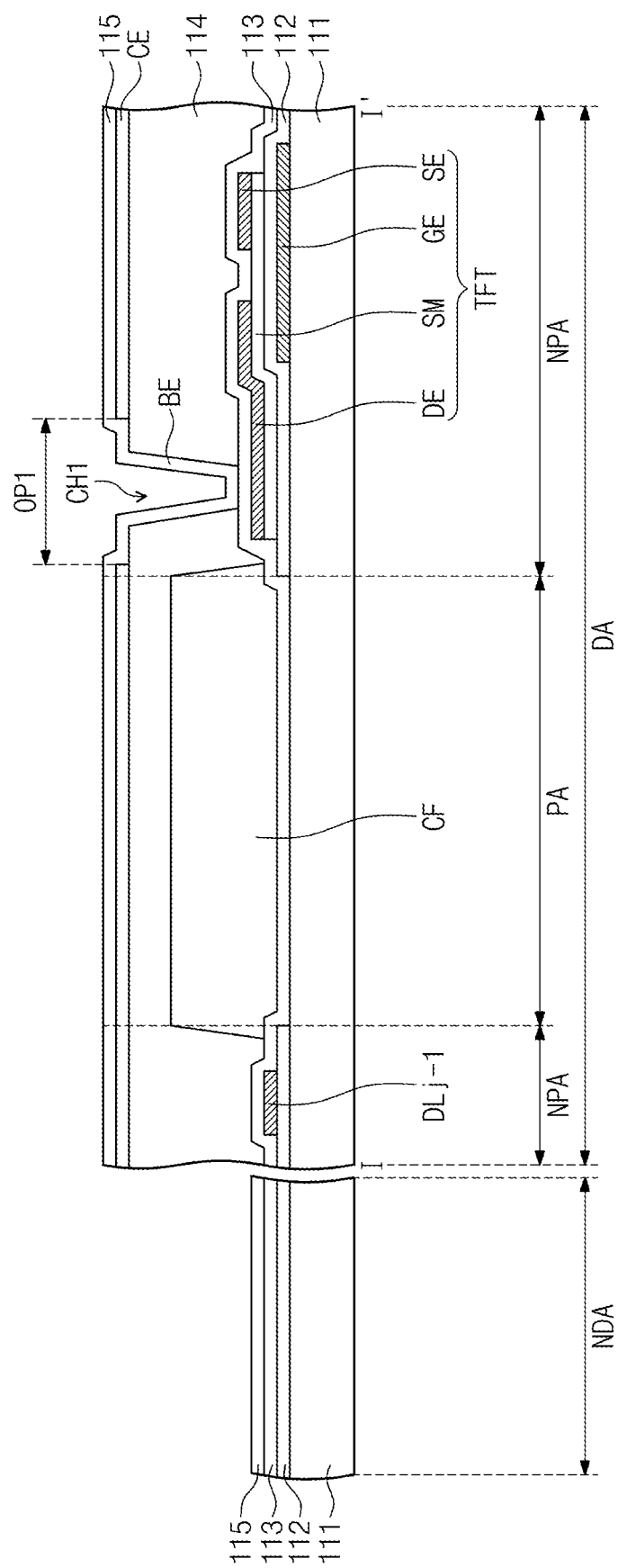

Referring to FIG. 11C, the common electrode CE is formed on the organic insulating layer 114 in the display area DA. The third inorganic insulating layer 115 is formed on the organic insulating layer 114 in the display area DA to cover the common electrode CE. The third inorganic insulating layer 115 is formed on the second inorganic insulating layer 113 in the non-display area NDA.

Figure 11D:
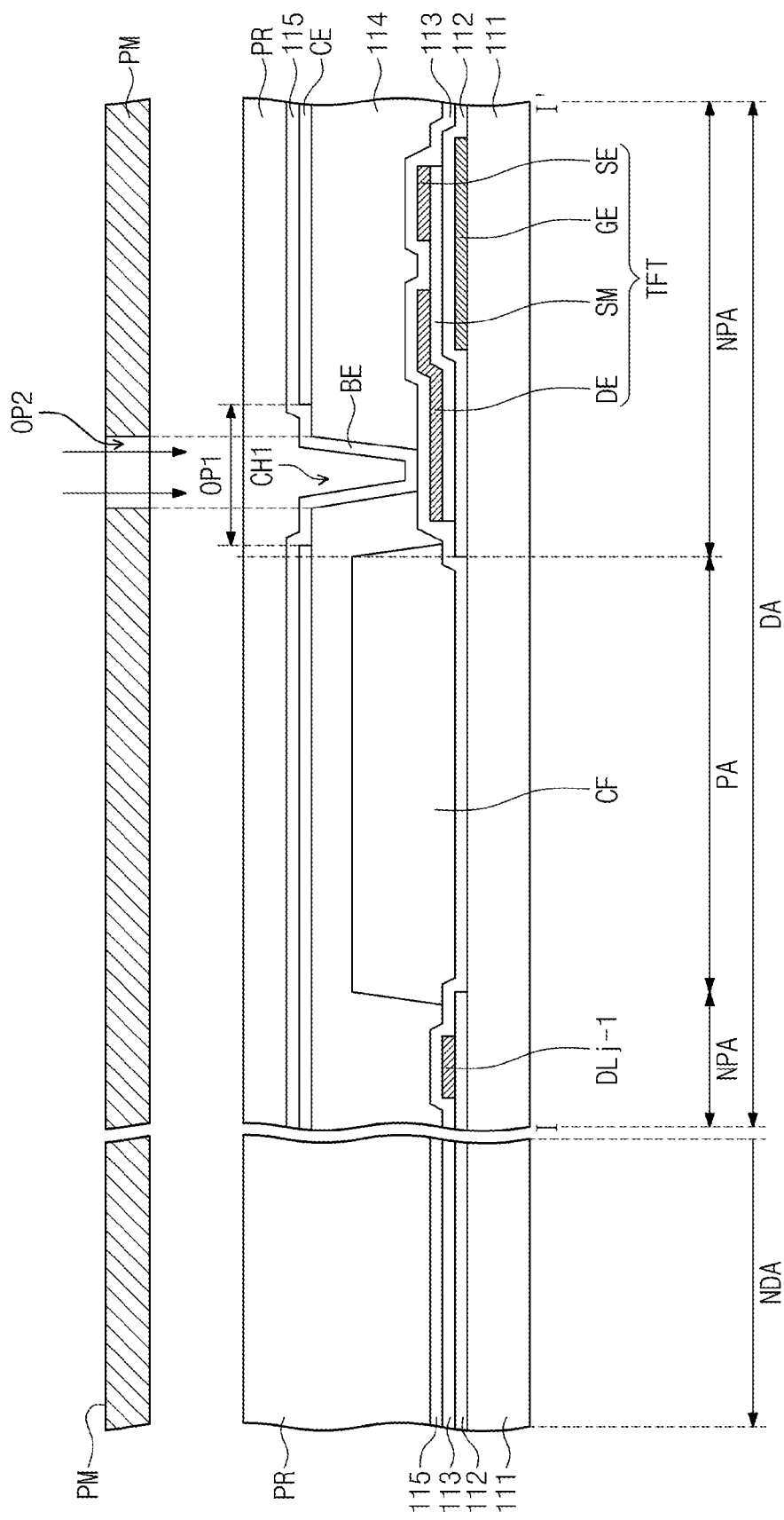

Referring to FIG. 11D, the photosensitive resin PR is formed on the third inorganic insulating layer 115 in the display area DA and the non-display area NDA. The photo mask PM is disposed above the photosensitive resin PR. The photo mask PM includes the second opening OP2 corresponding to the first contact hole CH1.

The exposure and development process of the photosensitive resin PR using the photo mask PM and the etch process of the second and third inorganic insulating layers 113 and 115 are substantially the same as those shown in FIG. 6D.

Figure 11E:
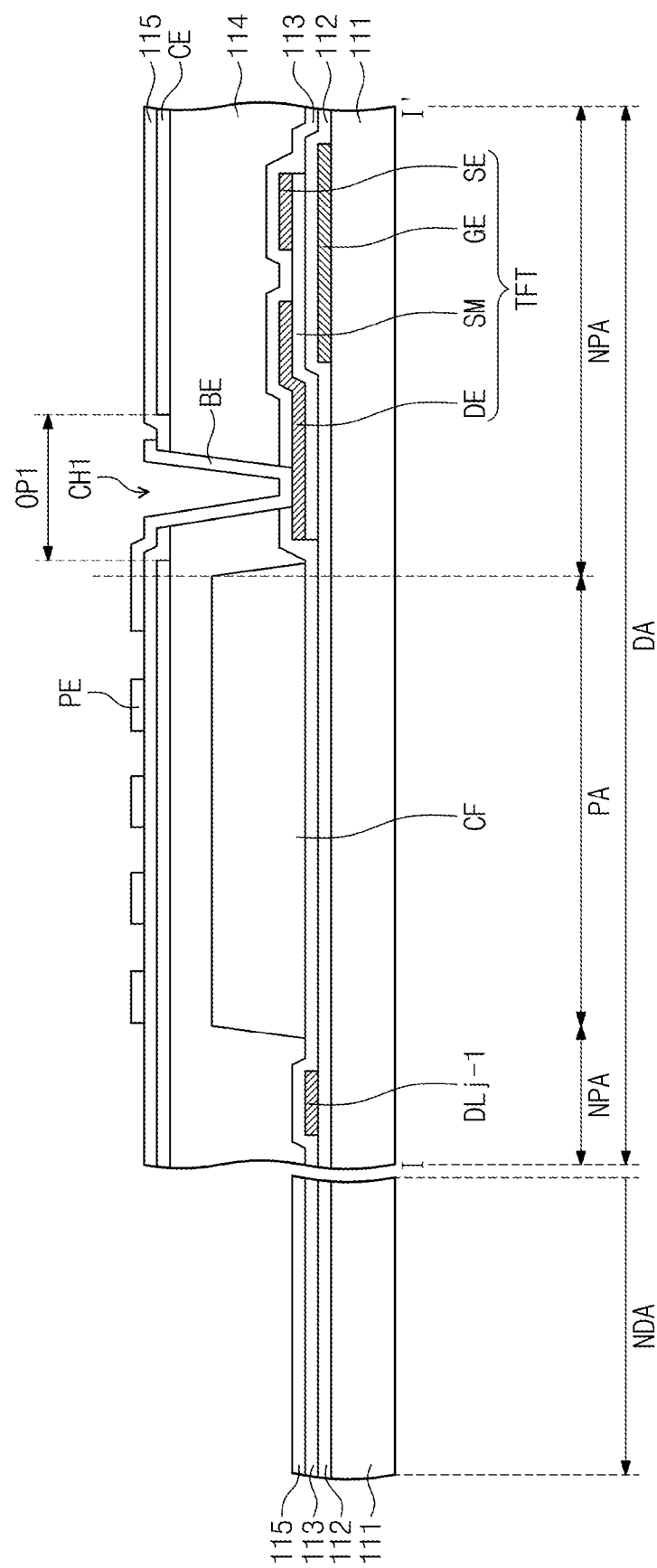

Referring to FIG. 11E, the third inorganic insulating layer 115 and the second inorganic insulating layer 113 are removed from the area corresponding to the first contact hole CH1, and thus the first contact hole CH1 is formed.

The pixel electrode PE is formed on the third inorganic insulating layer 115 in the pixel area PA. The branch electrode BE branched from the pixel electrode PE is electrically connected to the drain electrode DE of the thin film transistor TFT through the first contact hole CH1 in the non-pixel area NPA.

Referring to FIG. 11F, the black matrix BM is formed on the third inorganic insulating layer 115 in the non-pixel area NPA.

The black matrix BM is formed on the third inorganic insulating layer 115 in the non-display area NDA. The sealing member 10 is formed on the black matrix BM in the non-display area NDA. Although not shown in figures, the first substrate 110 and the second substrate 120 are attached to each other by the sealing member 10.

As described above, the organic insulating layer 114 is not formed on the second inorganic insulating layer 113 in the non-display area NDA of the display apparatus according to the third exemplary embodiment. Accordingly, the black matrix BM and the sealing member 10 make contact with each other.

Since the black matrix BM and the sealing member 10, which are formed of the organic material, make contact with each other, the adhesive force becomes strong. As a result, the separation phenomenon may be prevented from occurring, the moisture may be prevented from entering, and the peel strength between the first substrate 110 and the second substrate 120 may be prevented from being lowered.

Consequently, the display apparatus according to the third exemplary embodiment may have improved reliability.

Although the exemplary embodiments have been described, it is understood that the inventive concept should not be limited to these exemplary embodiments but various changes and modifications can be made by one of ordinary skilled in the art within the spirit and scope of the inventive concept as hereinafter claimed.

What is claimed is:

1. A display apparatus comprising:
a first substrate that includes a display area in which pixels are arranged and a non-display area surrounding the display area;
a second substrate disposed to face the first substrate; and
a sealing member disposed in the non-display area to attach the second substrate to the first substrate, the first substrate comprising:
a base substrate;
a first inorganic insulating layer disposed on the base substrate;
a second inorganic insulating layer disposed on the first inorganic insulating layer; and
an organic layer disposed on the first and second inorganic insulating layers, wherein the organic layer comprises:
an organic insulating layer disposed on the second inorganic insulating layer; and
a black matrix directly on the organic insulating layer in the non-display area, and the sealing member is directly on the black matrix; and
a third inorganic insulating layer disposed on the organic insulating layer in the display area, the black matrix being directly on the third inorganic insulating layer in the display area.

2. The display apparatus of claim 1, wherein the first and second inorganic insulating layers comprise an inorganic material and the organic insulating layer, the black matrix, and the sealing member comprise an organic material.

3. The display apparatus of claim 1, wherein each of the pixels comprises:
a thin film transistor disposed on the base substrate;
the second inorganic insulating layer disposed on the base substrate to cover the thin film transistor;
the organic insulating layer disposed on the second inorganic insulating layer;
a common electrode disposed on the organic insulating layer and including a first opening;
the third inorganic insulating layer disposed on the organic insulating layer to cover the common electrode; and
a pixel electrode disposed on the third inorganic insulating layer in a pixel area corresponding to the pixel, the pixel electrode is connected to the thin film transistor through a first contact hole formed through the second inorganic insulating layer, the organic insulating layer, and the third inorganic insulating layer, the first opening is overlapped with the first contact hole and has a size greater than a size of the first contact hole, and the first inorganic insulating layer is disposed on the base substrate to cover a gate electrode of the thin film transistor.

4. The display apparatus of claim 3, wherein the pixel further comprises a color filter disposed between the second inorganic insulating layer and the organic insulating layer in the pixel area, and the black matrix is disposed on the third inorganic insulating layer in a non-pixel area disposed adjacent to the pixel area.

5. The display apparatus of claim 3, wherein the pixel electrode comprises:
a plurality of branch portions disposed to be spaced apart from each other at regular intervals;
a first connection portion that connects one ends of the branch portions in a direction in which the branch portions extend; and
a second connection portion that connects the other ends of the branch portions.

6. The display apparatus of claim 1, further comprising a liquid crystal layer disposed between the first substrate and the second substrate.

7. A method of manufacturing a display apparatus, comprising:
preparing a base substrate that includes a display area in which pixels are disposed and a non-display area disposed adjacent to the display area;
forming a first inorganic insulating layer on the base substrate;
forming a second inorganic insulating layer on the first inorganic insulating layer;
forming an organic layer on the first and second inorganic insulating layers, wherein the forming of the organic layer comprises:

forming an organic insulating layer on the second inorganic insulating layer;

forming a third inorganic insulating layer disposed on the organic insulating layer;

removing the third inorganic insulating layer from the non-display area; and forming a black matrix directly on the organic insulating layer in the non-display area and directly on the third inorganic insulating layer in the display area;

forming a sealing member directly on the black matrix;

disposing a second substrate to face the base substrate; and attaching the second substrate to the sealing member.

8. The method of claim 7, wherein the first, second, and third inorganic insulating layers comprise an inorganic material and the organic insulating layer, the black matrix, and the sealing member comprise an organic material.

9. The method of claim 7, wherein each of the pixels comprises:

a thin film transistor disposed on the base substrate;

the second inorganic insulating layer disposed on the base substrate to cover the thin film transistor;

the organic insulating layer disposed on the second inorganic insulating layer;

a common electrode disposed on the organic insulating layer and including a first opening;

the third inorganic insulating layer disposed on the organic insulating layer to cover the common electrode; and a pixel electrode disposed on the third inorganic insulating layer in a pixel area corresponding to the pixel, the pixel electrode is connected to the thin film transistor through a first contact hole formed through the second inorganic insulating layer, the organic insulating layer, and the third inorganic insulating layer, the first opening is overlapped with the first contact hole and has a size greater than a size of the first contact hole, and the first inorganic insulating layer is disposed on the base substrate to cover a gate electrode of the thin film transistor.

* * * * *